United States Patent
Tran et al.

(10) Patent No.: US 9,601,174 B2
(45) Date of Patent: Mar. 21, 2017

(54) MAGNETOELECTRIC DEVICE, METHOD FOR FORMING A MAGNETOELECTRIC DEVICE, AND WRITING METHOD FOR A MAGNETOELECTRIC DEVICE

(71) Applicant: Agency for Science, Technology and Research, Singapore (SG)

(72) Inventors: Michael Tran, Singapore (SG); Cheow Hin Sim, Singapore (SG); Guchang Han, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 36 days.

(21) Appl. No.: 14/632,442

(22) Filed: Feb. 26, 2015

(65) Prior Publication Data

US 2015/0255135 A1  Sep. 10, 2015

(30) Foreign Application Priority Data

Mar. 5, 2014 (SG) .......................... 10201400395Q

(51) Int. Cl.
*G11C 11/16* (2006.01)
*H01L 43/08* (2006.01)
*H01L 43/10* (2006.01)
*H01L 43/12* (2006.01)

(52) U.S. Cl.
CPC ........ *G11C 11/161* (2013.01); *G11C 11/1675* (2013.01); *H01L 43/08* (2013.01); *H01L 43/10* (2013.01); *H01L 43/12* (2013.01)

(58) Field of Classification Search
CPC ...................................................... G11C 11/16

USPC .......................................................... 365/158
See application file for complete search history.

(56) References Cited

U.S. PATENT DOCUMENTS

| | | | | |
|---|---|---|---|---|
| 2006/0017126 A1* | 1/2006 | Bhattacharyya | ...... | H01L 27/222 257/421 |
| 2010/0238717 A1* | 9/2010 | Nakayama | ............. | B82Y 25/00 365/158 |
| 2012/0205763 A1* | 8/2012 | Ranjan | ................... | B82Y 10/00 257/421 |
| 2014/0008742 A1* | 1/2014 | Chen | ..................... | G01R 33/098 257/421 |
| 2014/0169083 A1* | 6/2014 | Wang | ..................... | G11C 11/161 365/158 |
| 2014/0183673 A1* | 7/2014 | Zhang | ...................... | H01L 29/82 257/421 |

(Continued)

*Primary Examiner* — Min Huang
(74) *Attorney, Agent, or Firm* — K. David Crockett, Esq.; Niky Economy Syrengelas, Esq.; Crockett & Crockett, PC

(57) ABSTRACT

A magnetoelectric device is provided. The magnetoelectric device includes a reference magnetic layer structure having a fixed magnetization orientation, and a synthetic antiferromagnetic layer structure including a free magnetic layer structure and a coupling magnetic layer structure antiferromagnetically coupled to each other, each of the free magnetic layer structure and the coupling magnetic layer structure having a magnetization orientation that is variable, wherein the reference magnetic layer structure and the synthetic antiferromagnetic layer structure are arranged one over the other. According to further embodiments of the present invention, a method for forming a magnetoelectric device and a writing method for a magnetoelectric device are also provided.

15 Claims, 10 Drawing Sheets

(56) References Cited

U.S. PATENT DOCUMENTS

| | | | |
|---|---|---|---|
| 2014/0269036 A1* | 9/2014 | Pi | G11C 11/1675 365/158 |
| 2014/0301135 A1* | 10/2014 | Guo | H01L 43/08 365/158 |
| 2016/0020250 A1* | 1/2016 | Li | H01L 27/224 365/158 |
| 2016/0079307 A1* | 3/2016 | Lu | H01L 27/222 257/421 |
| 2016/0163965 A1* | 6/2016 | Han | H01L 43/08 257/467 |

* cited by examiner

140

Form a reference magnetic layer structure having a fixed magnetization orientation — 141

Form a synthetic antiferromagnetic layer structure comprising a free magnetic layer structure and a coupling magnetic layer structure antiferromagnetically coupled to each other, each of the free magnetic layer structure and the coupling magnetic layer structure having a magnetization orientation that is variable, wherein the reference magnetic layer structure and the synthetic antiferromagnetic layer structure are arranged one over the other — 143

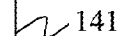

145

Determine a resistance state of the magnetoelectric device — 146

After determining the resistance state, apply a voltage to vary a magnetization orientation of a free magnetic layer structure of the magnetoelectric device from a first direction to a second direction different from the first direction, and to vary a magnetization orientation of a coupling magnetic layer structure of the magnetoelectric device from the second direction to the first direction, the free magnetic layer structure and the coupling magnetic layer structure being antiferromagnetically coupled to each other — 148

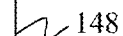

MAGNETOELECTRIC DEVICE, METHOD FOR FORMING A MAGNETOELECTRIC DEVICE, AND WRITING METHOD FOR A MAGNETOELECTRIC DEVICE

CROSS-REFERENCE TO RELATED APPLICATION

This application claims the benefit of priority of Singapore patent application No. 10201400395Q, filed Mar. 5, 2014, the contents of which are incorporated herein by reference for all purposes.

TECHNICAL FIELD

Various embodiments relate to a magnetoelectric device, a method for forming a magnetoelectric device and a writing method for a magnetoelectric device.

BACKGROUND

Magnetic tunnel junctions (MTJs) are one of the basic building block of spintronics; they are made up of at least a thin oxide barrier (typically magnesium oxide or alumina) which separates two ferromagnetic layers. One of these ferromagnetic layers is called the reference layer (RL) and has its magnetization fixed in space thanks to a high magnetic anisotropy or a strong exchange coupling to another layer. The second ferromagnetic layer is called the free layer (FL) and its magnetization can be rotated in space between two stable states.

The resistance of a MTJ depends on the relative orientation of the FL and RL due to the tunneling magnetoresistance (TMR) effect. In recent years, it has been found that magnetic momentum can be transferred from the RL to the FL and vice versa, depending on the polarity of the electrical current applied to the MTJ, across a thin oxide layer; where this effect is called Spin Transfer Torque (STT). An MTJ therefore forms the basic structure of an STT-MRAM (Magnetic Random Access Memory), in which the data bit is written by STT and read by TMR. In typical STT-MRAM devices, a bipolar electric current of the order of 1-10 $MA/cm^2$ is applied across an MTJ during 5-10 ns to write a data bit, which results in an energy consumption of the order of 0.1-0.3 pJ.

One of the big challenges the STT-MRAM is facing is the high writing current density (Jc), while maintaining high thermal stability (A) as the size of the memory cell shrinks. Recent studies have shown that an electric-field (E-field) can change the perpendicular magnetic anisotropy (PMA) of a magnetic layer in MTJs and such an E-field effect is proven to be the alternative energy-efficient (corresponding to a Jc down to $10^4$ $A/cm^{-2}$) route to manipulate the magnetization of a magnetic layer as compared to the usual magnetic field and STT switching.

So far, only two writing schemes employing the E-field effect have been described in the literature: (1) Bistable magnetic switching using a combination of unipolar voltage-induced coercivity (Hc) reduction, STT and an intrinsic or external magnetic bias field, and (2) Precessional switching by a combination of an intrinsic or external magnetic bias field and a unipolar voltage pulse-induced dynamic magnetization switching. While the former is limited by the operation speed due to the thermally activated switching process and the switching reliability, the latter is very sensitive to the pulse duration and requires an in-plane bias magnetic field. These two schemes dramatically suffer from a large write error rate (WER) because of the narrow window of the E-field dependency on the voltage, pulse width and bias field, and it is thus nearly impossible to develop a process in order to implement such writing schemes in practical stack structures.

Some of the challenges in the prior art include the requirement of precise control of the pulse duration, switching pulse duration which may be sensitive to the cell dimensions and the need for an external in-plane field as the intrinsic anisotropy field leads to uncontrolled switching.

Therefore, there is need to provide magnetic switching having a large margin for pulse duration, and/or robust against process, and/or where no external field is required.

SUMMARY

According to an embodiment, a magnetoelectric device is provided. The magnetoelectric device may include a reference magnetic layer structure having a fixed magnetization orientation, and a synthetic antiferromagnetic layer structure including a free magnetic layer structure and a coupling magnetic layer structure antiferromagnetically coupled to each other, each of the free magnetic layer structure and the coupling magnetic layer structure having a magnetization orientation that is variable, wherein the reference magnetic layer structure and the synthetic antiferromagnetic layer structure are arranged one over the other.

According to an embodiment, a method for forming a magnetoelectric device is provided. The method may include forming a reference magnetic layer structure having a fixed magnetization orientation, forming a synthetic antiferromagnetic layer structure including a free magnetic layer structure and a coupling magnetic layer structure antiferromagnetically coupled to each other, each of the free magnetic layer structure and the coupling magnetic layer structure having a magnetization orientation that is variable, wherein the reference magnetic layer structure and the synthetic antiferromagnetic layer structure are arranged one over the other.

According to an embodiment, a writing method for a magnetoelectric device is provided. The writing method may include determining a resistance state of the magnetoelectric device, and after determining the resistance state, applying a voltage to vary a magnetization orientation of a free magnetic layer structure of the magnetoelectric device from a first direction to a second direction different from the first direction, and to vary a magnetization orientation of a coupling magnetic layer structure of the magnetoelectric device from the second direction to the first direction, the free magnetic layer structure and the coupling magnetic layer structure being antiferromagnetically coupled to each other.

BRIEF DESCRIPTION OF THE DRAWINGS

In the drawings, like reference characters generally refer to like parts throughout the different views. The drawings are not necessarily to scale, the emphasis instead generally being placed upon illustrating the principles of the invention. In the following description, various embodiments of the invention are described with reference to the following drawings, in which:

FIG. 1C shows a flow chart illustrating a method for forming a magnetoelectric device, according to various embodiments.

FIG. 1D shows a flow chart illustrating a writing method for a magnetoelectric device, according to various embodiments.

DETAILED DESCRIPTION

Figure 1A:
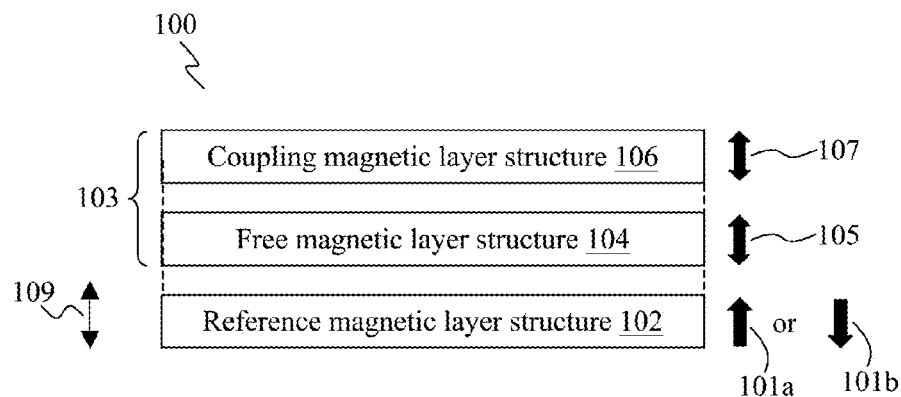
FIGS. 1A and 1B show schematic cross-sectional views of a magnetoelectric device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to the field of magnetoelectric non-volatile memories and methods of production thereof. For example, various embodiments may relate to non-volatile memories which are voltage-controlled, as opposed to current-controlled (such as spin-transfer torque magnetic random-access memory, STT-MRAM), and/or various embodiments may relate to the use of synthetic antiferromagnet (SAF) structures for the free layer.

Various embodiments may provide a method of switching a ferromagnet (for example, a ferromagnetic layer, e.g., a ferromagnetic soft layer such as a free layer).

Various embodiments may provide a magnetic memory that may be similar to an STT-MRAM, which does however not make use of the spin-transfer torque to change the direction of the magnetization of the free layer; instead, it makes use of the electric field effect. The bistable magnetization switching in various embodiments may be realized through a unipolar electric field (e.g., in the form of a unipolar voltage signal, e.g., one or more unipolar voltage pulses) applied to the memory cell.

It is known that the electric field effect can only increase or reduce the interfacial magnetic anisotropy of a free layer, and cannot result in a bistable magnetization switching when used in a typical or conventional STT-MRAM structure. In the state-of-the-art, the problem is solved by applying an in-plane magnetic field to induce precession or precessional motion. The precessional switching scheme of the prior art requires a precise control of the voltage pulse width, which is not easily applicable in a real memory. Applying an in-plane field in a real memory is also hardly applicable. However, various embodiments may provide a solution to the above-mentioned problem(s), and which may be easily implemented.

Various embodiments may provide a stable and reliable bistable magnetization switching method using a free layer structure (e.g., a synthetic antiferromagnetic layer structure) including or consisting of a ferromagnetic storage layer (e.g., a free magnetic layer structure), a non-magnetic spacer layer and a ferromagnetic coupled layer (e.g., a coupling magnetic layer structure). The non-magnetic spacer layer may provide exchange coupling between the storage layer and the coupled layer. The coupling magnetic layer structure may have a smaller magnetic moment than the free magnetic layer structure, and it may be antiferromagnetically coupled to the free magnetic layer structure. Moreover, the coupling magnetic layer structure may assist the free magnetic layer structure switching. To switch the magnetization of the free magnetic layer structure, a pulse of voltage may be applied across the magnetoelectric device or memory cell, and it may result in a toggle switching of the magnetization of the free magnetic layer structure (or storage layer) as well as the coupling magnetic layer structure (or coupled layer) due to the electric field-induced magnetic anisotropy reduction. Here, "toggle" switching may mean that the magnetization changes to the opposite direction after each voltage pulse. As a result, to write the correct state of the memory cell, the original state of the cell may need to be read before writing.

Without the coupling magnetic layer structure (or coupled layer), the free magnetic layer structure cannot be switched reversibly.

In various embodiments, the switching may be precessional, and therefore, it may be a very fast process which may be as fast as a few hundreds of picoseconds, depending on the materials' properties. Moreover, the electric field effect may be obtained for insulating layers a few nanometers (nm) thick, i.e., with a large resistance area product, limiting the value of electric current density flowing through the memory, and therefore leading to very small energy consumption needed to switch a bit, as low as a few femtoJoules (fJ).

The memory or magnetoelectric device of various embodiments does not require any in-plane magnetic field, and does not require any spin-transfer torque.

According to various embodiments, the above-mentioned effects may be achieved using a magnetic tunnel junction (MTJ) including or comprised of at least a reference layer (RL) (or a reference magnetic layer structure), an oxide layer (OX) (or an insulating layer), a storage layer also called free layer (FL) (or a free magnetic layer structure), a non-magnetic spacer layer (NM) and a coupled layer (CL) (or a coupling magnetic layer structure). The RL may be in contact on one side with a pinning structure (or a pinning magnetic layer structure) and on the other side with the OX. The FL itself may be in contact on one side with the OX and on the other side with the NM. On top of that, the NM may also be in contact with the CL. Generally, one or more or all ferromagnetic layers in various embodiments may have at least a uniaxial easy axis. The pinning structure in various embodiments may be a multilayer structure including or composed of at least one ferromagnetic layer (or a magnetic layer) and one non-magnetic coupling layer, forming a so-called synthetic antiferromagnetic (SAF) coupling with the RL. The pinning structure may also include an antiferromagnetic (AFM) layer (such as PtMn or IrMn, NiMn, etc.) to enhance the pinning stability of the RL and reduce the stray field from the RL and the pinning structure at the FL. In various embodiments, the MTJ stacks may include: substrate/seed layers/pinning structure/RL/OX/FL/NM/CL/capping layers, or substrate/seed layers/CL/NM/FL/OX/RL/pinning structure/capping layers.

In various embodiments, the RL (or reference magnetic layer structure) may have its magnetization easy axis perpendicular to the plane of the layer. It may include or consist of any combination of magnetic and non-magnetic materials. Its magnetic stability should exceed that of the FL (or free magnetic layer structure) and the CL (or coupling magnetic layer structure), so that its magnetization may not or may never be switched during device operation. A non-limiting example may be a multilayer of [Co/Pt] or [Co/Pd] coupled to a layer of CoFeB through a tantalum (Ta) interlayer, which itself may be in contact with the OX (or insulating layer) in order to maximize the spin polarization and therefore the tunnel magnetoresistance (TMR).

In various embodiments, the OX (or insulating layer) thickness may be such that it may behave as a tunnel barrier with a resistance-area product sufficiently high such that the STT does not affect the FL magnetization within the range of bias voltages used for normal operation. The materials for OX may be to provide high TMR and the large tuning of the magnetic anisotropy of the FL by an E-field. The OX may include or consist of, for example, a magnesium oxide (MgO) or aluminum oxide ($Al_2O_3$) or any combination of other oxide layers with a thickness ranging from about 1 nm to about 2.5 nm.

In various embodiments, the FL (or free magnetic layer structure) may have its magnetization easy axis perpendicular to the plane of the layer at low applied electric field. It may include or consist of any combination of magnetic and non-magnetic materials. The layers in contact with the FL may be chosen so as to allow the FL magnetic anisotropy to be modulated by an electric field. The magnetic anisotropy of the FL should be strong enough to maintain its magnetization along the desired easy axis, but not too strong so that manipulating it with the electric field effect allows tilting its magnetization from its easy axis to almost 90° from it. In one example, the FL may include or consist of a single layer of CoFeB, or a lamination of CoFeB and Ta. In another example, the FL may include or consist of a multilayer of [Co/Pt] or [Co/Pd] coupled to a layer of CoFeB, which itself may be in contact with the OX in order to maximize the spin polarization and therefore the TMR. It should be appreciated that the free layer in various embodiments may use materials with any damping constant, contrary to that in the STT-MRAM for which a material with a very low damping constant (e.g., <0.05) has to be used for the FL to reduce the switching current.

In various embodiments, the NM (or non-magnetic spacer layer) may include a metal which may possess a strong interlayer exchange coupling strength, which may be tuned to be anti-parallel (e.g., the exchange coupling strength may be negative). The NM may be a single layer of a non-magnetic metal such as ruthenium (Ru), chromium (Cr), and vanadium (V) with a thickness ranging from about 0.3 nm to about 2 nm as long as it may provide an antiferromagnetic exchange coupling between the FL and the CL.

In various embodiments, the CL (or coupling magnetic layer structure) may have its magnetization easy axis perpendicular to the plane of the layer and is antiferromagnetically coupled to the FL, across the NM. The CL may include or consist of any combination of ferromagnetic and non-magnetic materials. The thickness of the CL may be selected depending on the FL material and thickness so that the total magnetic moment of the CL may be less than that of the FL in order to have the CL switch before the FL after applying an electric field to the MTJs during write operation. Its magnetic anisotropy should be strong enough to maintain its magnetization along the desired easy axis, but not too strong so that the effective coupling field which couples the magnetization of the CL to the FL may be larger than the effective perpendicular magnetic anisotropy of the CL. Therefore, a change in the magnetization direction of the FL may result in switching of the magnetization of the CL.

Various embodiments may provide a magnetoelectric device including a first electrode, a second electrode spaced apart from said first electrode, and a voltage-controlled magnetic tunnel junction between said first and second electrodes.

Various embodiments may provide a magnetic tunnel junction in a magnetoelectric device (e.g., the magnetoelectric device as described above), the magnetic tunnel junction including a first ferromagnetic layer (e.g., a coupled layer, CL; a coupling magnetic layer structure), a first non-magnetic conducting layer (e.g., a non-magnetic spacer layer, NM) formed on top of said first ferromagnetic layer, a second ferromagnetic layer (e.g., a free layer, FL; a free magnetic layer structure), formed on top of said first non-magnetic conducting layer, an insulating layer formed on top of said second ferromagnetic layer, a third ferromagnetic layer (e.g., a reference layer, RL; a reference magnetic layer structure) formed on top of said insulating layer, wherein said first, second and third ferromagnetic layers have at least a uniaxial magnetic easy axis substantially perpendicular to their respective planes, wherein the first non-magnetic conducting layer possesses an interlayer magnetic coupling mechanism such as, but not limited to: Ruderman-Kittel-Kasuya-Yosida (RKKY), double-exchange or superexchange, wherein respective magnetizations of said first and second ferromagnetic layers are aligned anti-parallel to each other through exchange coupling across said first non-magnetic conducting layer, wherein the magnetic moment of said first ferromagnetic layers may be smaller than that of said second ferromagnetic layer, wherein respective magnetizations of said second and third ferromagnetic layers may be aligned parallel or anti-parallel to each other.

In various embodiments, the magnetic tunnel junction as described above may further include two additional layers. The magnetic tunnel junction may further include a second non-magnetic conducting layer (e.g., a non-magnetic coupling layer) formed on top of said third ferromagnetic layer, a fourth ferromagnetic layer (e.g., a magnetic layer) formed on top of said second non-magnetic conducting layer, wherein the second non-magnetic conducting layer possesses an interlayer magnetic coupling mechanism such as, but not limited to: Ruderman-Kittel-Kasuya-Yosida (RKKY), double-exchange or superexchange, wherein respective magnetizations of said third and fourth ferromagnetic layers are aligned anti-parallel to each other through exchange coupling across said second non-magnetic conducting layer, therefore forming what is known as a synthetic antiferromagnet (SAF), wherein the magnetic properties of said third and fourth ferromagnetic layers are chosen in order to reduce the total stray field on said second ferromagnetic layer.

Various embodiments may also provide a magnetic tunnel junction as discussed above, where the growth order of said layers is reversed. In other words, the sequence of the various layers of the magnetic tunnel junction may be in a reverse order.

In various embodiments of the magnetoelectric device, the electrical resistance between said first and second electrodes depends on the relative orientation of the respective magnetizations of said second and third ferromagnetic layers, and/or a voltage applied between said first and second electrodes causes a change in the magnetic anisotropy of at least one of said second or third ferromagnetic layers, and/or said insulating layer is thin enough to allow direct or sequential tunneling of carriers through it.

In various embodiments of the magnetoelectric device, the magnetization of said second ferromagnetic layer may be reversed so as to be parallel or anti-parallel to the magnetization of said third ferromagnetic layer by applying a voltage pulse between said first and second electrodes, and/or the magnetization of said second ferromagnetic layer may be aligned parallel or anti-parallel to the magnetization of said third ferromagnetic layer using pulses of the same voltage polarity, and/or the magnetization of said first ferromagnetic layer is reversed whenever the magnetization of said second ferromagnetic layer is reversed, and/or spin-transfer torque is not necessary for the magnetization reversal of said second ferromagnetic layer.

FIG. 1A shows a schematic cross-sectional view of a magnetoelectric device 100, according to various embodiments. The magnetoelectric device 100 includes a reference magnetic layer structure 102 having a fixed magnetization orientation (as represented by the single-headed arrow 101a or 101b), and a synthetic antiferromagnetic layer structure 103 including a free magnetic layer structure 104 and a coupling magnetic layer structure 106 antiferromagnetically coupled to each other, each of the free magnetic layer structure 104 and the coupling magnetic layer structure 106 having a magnetization orientation (as represented by the double-headed arrows 105, 107) that is variable, wherein the reference magnetic layer structure 102 and the synthetic antiferromagnetic layer structure 103 are arranged one over the other.

In other words, the magnetoelectric device 100 may include a reference magnetic layer structure 102 having a fixed magnetization orientation that may be arranged in one of two directions, for example, in an upward direction (as represented by the single-headed arrow 101a) or in a downward direction (as represented by the single-headed arrow 101b). The magnetoelectric device 100 may further include a synthetic antiferromagnetic layer structure 103 that may be arranged below the reference magnetic layer structure 102, or over (or on) the reference magnetic layer structure 102 (as shown in FIG. 1A). The synthetic antiferromagnetic layer structure 103 may include a free magnetic layer structure 104 and a coupling magnetic layer structure 106. The free magnetic layer structure 104 may have a magnetization orientation (as represented by the double-headed arrow 105) that may be variable or changed between two directions, for example, upward and downward directions.

The free magnetic layer structure 104 may be in a parallel (P) state relative to the reference magnetic layer structure 102 when the respective magnetization orientations 105, 101a or 101b are arranged in the same direction, while the free magnetic layer structure 104 may be in an anti-parallel (AP) state relative to the reference magnetic layer structure 102 when the respective magnetization orientations 105, 101a or 101b are arranged in opposite directions. In other words, the respective magnetization orientations 105, 101a or 101b of the free magnetic layer structure 104 and the reference magnetic layer structure 102 may be aligned parallel or anti-parallel to each other.

The coupling magnetic layer structure 106 may have a magnetization orientation (as represented by the double-headed arrow 107) that may be variable or changed between two directions, for example, upward and downward directions). As the free magnetic layer structure 104 and the coupling magnetic layer structure 106 are antiferromagnetically coupled to each other, the respective magnetization orientations 105, 107 may be arranged in opposite directions.

In various embodiments, the magnetoelectric device 100 may have an arrangement (e.g., a stack arrangement) of the reference magnetic layer structure 102 and the synthetic antiferromagnetic layer structure 103 one over the other.

In various embodiments, the free magnetic layer structure 104 may be arranged in between the reference magnetic layer structure 102 and the coupling magnetic layer structure 106.

In the context of various embodiments, the term "reference magnetic layer structure" may refer to a "fixed magnetic layer structure", and may mean a magnetic layer structure having a fixed magnetization orientation. The reference magnetic layer structure may include at least one of a ferromagnetic material or a ferrimagnetic material. The reference magnetic layer structure may include at least one of a hard ferromagnetic material or a hard ferrimagnetic material. The material of the fixed magnetic layer structure may be resistant to magnetization and demagnetization (i.e., not easily magnetized and demagnetized), and may have a high hysteresis loss and a high coercivity as its magnetization may be fixed or pinned. In the context of various embodiments, a reference magnetic layer structure may be referred to as a "hard layer", a "hard magnetic layer" or a "ferromagnetic hard layer". In the context of various embodiments, the reference magnetic layer structure may act as a reference layer. In the context of various embodiments, the reference magnetic layer structure 102 may be ferrimagnetic or ferromagnetic.

In the context of various embodiments, the reference magnetic layer structure 102 may include or consist of at least one of the following materials and/or alloys of the materials: chromium (Cr), manganese (Mn), iron (Fe), cobalt (Co), nickel (Ni), boron (B), carbon (C), oxygen (O), nitrogen (N), aluminium (Al), silicon (Si), titanium (Ti), vanadium (V), copper (Cu), zinc (Zn), gallium (Ga), germanium (Ge), zirconium (Zr), niobium (Nb), molybdenum (Mo), palladium (Pd), silver (Ag), antimony (Sb), tellurium (Te), hafnium (Hf), tantalum (Ta), tungsten (W), iridium (Ir), platinum (Pt), gold (Au), magnesium (Mg) or any combination thereof as multilayers (e.g., multilayers of [Co/Pt], multilayers of [Co/Pd], multilayers of [Co/Ni]), as alloys (e.g., CoPt, CoPd, CoFeBPt), or both (e.g., [Co/Pt]n/Ta/CoFeB). As non-limiting examples, the reference magnetic layer structure 102 may include a multilayer arrangement of [Co/Pt] or [Co/Pd] coupled to a layer of CoFeB through a tantalum (Ta) interlayer.

In the context of various embodiments, the reference magnetic layer structure 102 may have a thickness in a range of between about 1 nm and about 15 nm, for example, between about 1 nm and about 10 nm, between about 1 nm and about 5 nm, between about 5 nm and about 15 nm, or between about 5 nm and about 10 nm.

In the context of various embodiments, the term "free magnetic layer structure" may mean a magnetic layer structure having a variable or switchable magnetization orientation. In other words, the magnetization orientation may be varied or switched, for example in response to an electrical signal (e.g., voltage) applied to the magnetoelectric device. The free magnetic layer structure may include at least one of a ferromagnetic material or a ferrimagnetic material. The free magnetic layer structure may include at least one of a soft ferromagnetic material or a soft ferrimagnetic material. The material of the free magnetic layer structure may be receptive to magnetization and demagnetization (i.e., easily magnetized and demagnetized), and may have a small hysteresis loss and a low coercivity, in comparison to a fixed magnetic layer structure. In the context of various embodiments, a free magnetic layer structure may also be referred to as a "soft layer", a "soft magnetic layer" or a "ferromagnetic soft layer". In the context of various embodiments, the free magnetic layer structure may act as a free layer or a storage layer. In the context of various embodiments, the free magnetic layer structure 104 may be ferrimagnetic or ferromagnetic.

In the context of various embodiments, the free magnetic layer structure 104 may include or consist of at least one of the following materials and/or alloys of the materials: chromium (Cr), manganese (Mn), iron (Fe), cobalt (Co), nickel (Ni), boron (B), carbon (C), oxygen (O), nitrogen (N), aluminium (Al), silicon (Si), titanium (Ti), vanadium (V), copper (Cu), zinc (Zn), gallium (Ga), germanium (Ge), zirconium (Zr), niobium (Nb), molybdenum (Mo), palladium (Pd), silver (Ag), antimony (Sb), tellurium (Te), hafnium (Hf), tantalum (Ta), tungsten (W), iridium (Ir), platinum (Pt), gold (Au), magnesium (Mg) or any combination thereof as multilayers (e.g., Co/Ta/Co, Fe/Ta/Fe/Ta/Fe, Ni/Ta/Fe), as alloys (e.g., CoFeB, CoFeBTa, CoFeZn) or both (e.g., CoFeB/CoFeBTa/CoFeB). As non-limiting examples, the free magnetic layer structure 104 may include or consist of a single layer of CoFeB, or a lamination of CoFeB and Ta. As further non-limiting examples, the free magnetic layer structure may include or consist of a multilayer of [Co/Pt] or [Co/Pd] coupled to a layer of CoFeB.

In the context of various embodiments, the free magnetic layer structure 104 may have a damping constant more than 0.05 (e.g., >0.05), for example, 0.06, 0.08, or 0.1. However, it should be appreciated that a free magnetic layer structure having a damping constant less than 0.05 (e.g., <0.05) may also be provided.

In the context of various embodiments, the free magnetic layer structure 104 may have a thickness in a range of between about 1 nm and about 4 nm, for example, between about 1 nm and about 3 nm, between about 1 nm and about 2 nm, or between about 2 nm and about 4 nm.

In the context of various embodiments, the term "coupling magnetic layer structure" may mean a magnetic layer structure having a variable or switchable magnetization orientation that may be configured to be exchanged coupled with the free magnetic layer structure such that the free magnetic layer structure and the coupling magnetic layer structure may be antiferromagnetically coupled to each other so as to define a synthetic antiferromagnetic layer structure. The coupling magnetic layer structure may include at least one of a ferromagnetic material or a ferrimagnetic material. The coupling magnetic layer structure may include at least one of a soft ferromagnetic material or a soft ferrimagnetic material. In the context of various embodiments, the coupling magnetic layer structure may be referred to as a coupled layer. In the context of various embodiments, the coupling magnetic layer structure 106 may be ferrimagnetic or ferromagnetic. In the context of various embodiments, the coupling magnetic layer structure 106 may include or consist of any combination of ferromagnetic and non-magnetic materials.

In the context of various embodiments, the coupling magnetic layer structure 106 may include or consist of at least one of the following materials, and/or oxides of the materials and/or alloys of the materials: chromium (Cr), manganese (Mn), iron (Fe), cobalt (Co), nickel (Ni), boron (B), carbon (C), oxygen (O), nitrogen (N), aluminium (Al), silicon (Si), titanium (Ti), vanadium (V), copper (Cu), zinc (Zn), gallium (Ga), germanium (Ge), zirconium (Zr), niobium (Nb), molybdenum (Mo), palladium (Pd), silver (Ag), antimony (Sb), tellurium (Te), hafnium (Hf), tantalum (Ta), tungsten (W), iridium (Ir), platinum (Pt), gold (Au), magnesium (Mg) or any combination thereof as multilayers (e.g., multilayers of [Co/Pt], multilayers of [Co/Pd], multilayers of [Co/Ni]), as alloys (e.g., CoPt, CoPd, CoFeBPt), as both (e.g., multilayers of [CoFe/Ni]) or including an oxide (e.g. CoFeB/MgO), or as a single layer of FePt and CoPt alloys.

In the context of various embodiments, the coupling magnetic layer structure 106 may have a thickness in a range of between about 1 nm and about 10 nm, for example, between about 1 nm and about 5 nm, between about 1 nm and about 3 nm, between about 5 nm and about 10 nm, or between about 3 nm and about 8 nm.

In the context of various embodiments, the term "antiferromagnetically coupled" as applied to two magnetic layer structures may mean that the respective magnetization orientations of the two magnetic layer structures may be aligned anti-parallel to each other. In other words, the magnetization orientations of the two magnetic layer structures may be in opposite directions.

In the context of various embodiments, the reference magnetic layer structure 102 and the synthetic antiferromagnetic layer structure 103 may form or may be part of a magnetic junction (or a magnetic tunnel junction) of the magnetoelectric device 100.

In various embodiments, the magnetization orientation 105 of the free magnetic layer structure 104 may be variable from a first direction to a second direction different from the first direction in response to a first voltage applied to (or across) the magnetoelectric device 100. This may mean that a first electric field may be provided or generated across the free magnetic layer structure 104, as well as across the magnetoelectric device 100. In this way, switching of the magnetization orientation 105 of the free magnetic layer structure 104 may be achieved by means of the electric field effect.

In various embodiments, as a result of the antiferromagnetic coupling between the free magnetic layer structure 104 and the coupling magnetic layer structure 106, when the magnetization orientation 105 of the free magnetic layer structure 104 is variable from the first direction to the second direction in response to the first voltage, the magnetization orientation 107 of the coupling magnetic layer structure 106 may be variable from the second direction to the first direction in response to the first voltage.

In various embodiments, the first voltage may be a voltage pulse.

In various embodiments, the first direction and the second direction may be opposite directions. In various embodiments, the first direction may be parallel (or anti-parallel) to the fixed magnetization orientation 101a or 101b of the reference magnetic layer structure 102, while the second direction may be anti-parallel (or parallel) to the fixed magnetization orientation 101a or 101b of the reference magnetic layer structure 102. This may mean, for example, that the magnetization orientation 105 of the free magnetic layer structure 104 may be switched from a parallel direction (or an anti-parallel direction), relative to the fixed magnetization orientation 101a or 101b of the reference magnetic layer structure 102, to an anti-parallel direction (or a parallel direction) in response to the first voltage.

In various embodiments, the magnetization orientation 105 of the free magnetic layer structure 104 may be variable from the first direction to the second direction in response to the first voltage only or solely. This may mean that only the first voltage may be required for switching the magnetization orientation 105 of the free magnetic layer structure 104, and that other mechanisms or effects such as, for example, spin-transfer torque and/or magnetic field (e.g., an intrinsic or external magnetic bias field, or in-plane magnetic field) may not be required for switching the magnetization orientation 105 of the free magnetic layer structure 104.

In various embodiments, the magnetization orientation 105 of the free magnetic layer structure 104 may be variable from the second direction to the first direction in response to a second voltage applied to (or across) the magnetoelectric device 100, the first voltage and the second voltage having a same polarity. This may mean that a second electric field of the same polarity as the first electric field may be provided or generated across the free magnetic layer structure 105, as well as across the magnetoelectric device 100. In this way, bistable magnetization switching may be realized through a unipolar electric field applied to the magnetoelectric device 100. Therefore, the magnetization orientation 105 of the free magnetic layer structure 104 may be switched from the first direction to the second direction and vice versa using unipolar voltages, meaning, for example, bipolar switching of the magnetization of the free magnetic layer structure 104 may be achieved with respective unipolar voltage pulses.

Accordingly, toggle switching of the magnetization orientation 105 of the free magnetic layer structure 104, where the magnetization orientation 105 of the free magnetic layer structure 104 changes to an opposite direction after each voltage pulse, may be achieved.

In various embodiments, as a result of the antiferromagnetic coupling between the free magnetic layer structure 104 and the coupling magnetic layer structure 106, when the magnetization orientation 105 of the free magnetic layer structure 104 is variable from the second direction to the first direction in response to the second voltage, the magnetization orientation 107 of the coupling magnetic layer structure 106 may be variable from the first direction to the second direction in response to the second voltage.

In various embodiments, the second voltage may be a voltage pulse.

In various embodiments, the first voltage and the second voltage may have the same pulse duration or different pulse durations.

In various embodiments, the first voltage and the second voltage may have the same magnitude or different magnitudes.

In various embodiments, the magnetization orientation 105 of the free magnetic layer structure 104 may be variable from the second direction to the first direction in response to the second voltage only or solely. This may mean that only the second voltage may be required for switching the magnetization orientation 105 of the free magnetic layer structure 104, and that other mechanisms or effects such as, for example, spin-transfer torque and/or magnetic field (e.g., an intrinsic or external magnetic bias field, or in-plane magnetic field) may not be required for switching the magnetization orientation 105 of the free magnetic layer structure 104.

In various embodiments, the magnetization orientation 105 of the free magnetic layer structure 104 may be variable between a first direction and a second direction different from the first direction in response to a voltage applied to the magnetoelectric device 100, without the free magnetic layer structure 104 being subjected to at least one of spin-transfer torque effect or a magnetic field. In this way, switching of the magnetization orientation 105 of the free magnetic layer structure 104 may be achieved by means of the electric field effect, without the use of a spin-polarized current (spin-transfer torque effect) and/or a magnetic field.

In various embodiments, a magnetic moment of the free magnetic layer structure 104 is more than a magnetic moment of the coupling magnetic layer structure 106. In the context of various embodiments, the term "magnetic moment" as applied to a magnetic layer structure may refer to a "magnetic thickness" of the magnetic layer structure. In the context of various embodiments, the terms "magnetic moment" and "magnetic thickness" may be defined as (Mxt) where the parameter "M" refers to the saturation magnetization of the magnetic layer structure while the parameter "t" refers to the thickness of the magnetic layer structure. Accordingly, in various embodiments, $M_{s1} \times t_1 > M_{s2} \times t_2$ may be provided, where $M_{s1}$ and $t_1$ are the saturation magnetization and thickness, respectively, of the free magnetic layer structure 104, and $M_{s2}$ and $t_2$ are the saturation magnetization and thickness, respectively, of the coupling magnetic layer structure 106.

Figure 1B:
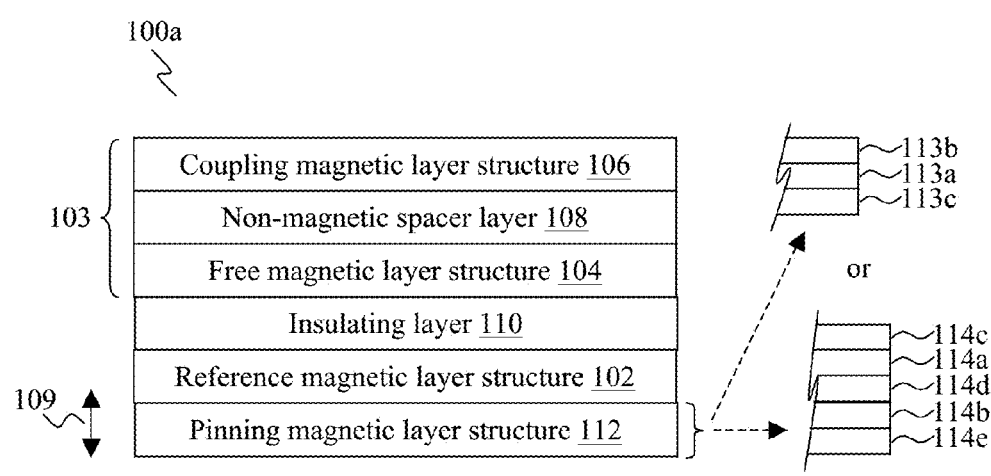

FIG. 1B shows a schematic cross-sectional view of a magnetoelectric device 100a, according to various embodiments. The magnetoelectric device 100a may include a reference magnetic layer structure 102, and a synthetic antiferromagnetic layer structure 103 including a free magnetic layer structure 104 and a coupling magnetic layer structure 106 antiferromagnetically coupled to each other. The magnetoelectric device 100a may be as described above in the context of the magnetoelectric device 100.

In various embodiments, the magnetoelectric device 100a may further include an insulating layer (e.g., a non-magnetic insulating layer) 110 arranged in between the free magnetic layer structure 104 and the reference magnetic layer structure 102. The insulating layer 110 may be or may act as a tunnel barrier. The insulating layer 110 may be arranged in contact with the free magnetic layer structure 104 and/or the reference magnetic layer structure 102.

In the context of various embodiments, by arranging the insulating layer 110 between the free magnetic layer structure 104 and the reference magnetic layer structure 102, the magnetoelectric device 100a may be configured as a tunnel magnetoresistive (TMR) device. This may mean that in the context of various embodiments, the reference magnetic layer structure 102 and the synthetic antiferromagnetic layer structure 103, together with the insulating layer 110, may form or may be part of a magnetic tunnel junction (MTJ) (e.g., a voltage-controlled magnetic tunnel junction) of the magnetoelectric device 100a.

In the context of various embodiments, the insulating layer 110 may include a non-conductive and non-magnetic material, or an insulator material.

In the context of various embodiments, the insulating layer 110 may include or may be an oxide layer (e.g., an oxide barrier). The insulating layer 110 may include or consist of an oxide of at least one of the following materials or any combinations therefore: magnesium (Mg), chromium (Cr), aluminium (Al), silicon (Si), titanium (Ti), vanadium (V), copper (Cu), zinc (Zn), gallium (Ga), germanium (Ge), hafnium (Hf), tantalum (Ta), tungsten (W). As non-limiting examples, the insulating layer 110 may include or consist of at least one of magnesium oxide (MgO), aluminium oxide (AlO), hafnium oxide (HfO$_2$), tantalum oxide (Ta$_2$O$_5$) or any combination thereof.

In the context of various embodiments, the insulating layer 110 may include or consist of an organic compound with at least insulating properties, including but not limited to tris-(8-hydroxyquinoline)aluminum (Al(C$_9$H$_6$NO)$_3$; Alq3) or polyvinylidene fluoride (PVDF).

In various embodiments, the insulating layer 110 may include or consist of any combination of an oxide (e.g., any of the oxides described above) and an organic compound (e.g., any of the organic compounds described above).

In the context of various embodiments, the insulating layer 110 may have a thickness in a range of between about 1 nm and about 2.5 nm, for example, between about 1 nm and about 2 nm, between about 1 nm and about 1.5 nm, or between about 1.5 nm and about 2.5 nm.

In various embodiments, the insulating layer 110 may have a predetermined thickness sufficient to prevent the free magnetic layer structure 104 being subjected to spin-transfer torque effect.

In various embodiments, the synthetic antiferromagnetic layer structure 103 may further include a non-magnetic spacer layer 108 arranged in between the free magnetic layer structure 104 and the coupling magnetic layer structure 106. In this way, the free magnetic layer structure 104 and the coupling magnetic layer structure 106 may be antiferromagnetically coupled to each other through the non-magnetic spacer layer 108. In various embodiments, the non-magnetic spacer layer 108 may facilitate or provide or enable exchange coupling between the free magnetic layer structure 104 and the coupling magnetic layer structure 106.

In various embodiments, the free magnetic layer structure 104 may be arranged in between the insulating layer 110 and the non-magnetic spacer layer 108.

In various embodiments, the non-magnetic spacer layer 108 may be arranged in contact with the free magnetic layer structure 104 and/or the coupling magnetic layer structure 106.

In the context of various embodiments, the magnetoelectric device 100a may have an arrangement (e.g., a stack arrangement) having, in sequence, the reference magnetic layer structure 102, the insulating layer 110, and the synthetic antiferromagnetic layer structure 103. For example, the magnetoelectric device 110a may have an arrangement (e.g., a stack arrangement) having, in sequence, the reference magnetic layer structure 102, the insulating layer 110, the free magnetic layer structure 104, the non-magnetic spacer layer 108 and the coupling magnetic layer structure 106. It should be appreciated that the reverse sequence of the arrangements described above may also be provided for the magnetoelectric device 110a.

In various embodiments, the non-magnetic spacer layer 108 may possess an interlayer magnetic coupling mechanism such as, but not limited to: Ruderman-Kittel-Kasuya-Yosida (RKKY), or double-exchange or superexchange.

In various embodiments, the non-magnetic spacer layer 108 may be a non-magnetic conducting layer. The non-magnetic spacer layer 108 may include a conductive and non-magnetic material.

In the context of various embodiments, the non-magnetic spacer layer 108 may include a metal which may possess a strong interlayer exchange coupling strength.

In the context of various embodiments, the non-magnetic spacer layer 108 may include at least one of the elements: ruthenium (Ru), rhodium (Rh), chromium (Cr), vanadium (V), molybdenum (Mo), or any combination thereof, or any alloys of the mentioned elements such as ruthenium-tantalum (Ru—Ta). As non-limiting examples, the non-magnetic spacer layer 108 may be a single layer of a non-magnetic metal such as ruthenium (Ru), chromium (Cr) or vanadium (V).

In the context of various embodiments, the non-magnetic spacer layer 108 may have a thickness in a range of between about 0.3 nm and about 2 nm, for example, between about 0.3 nm and about 1 nm, between about 0.3 nm and about 0.5 nm, between about 0.6 nm and about 2 nm, 0.6 nm and about 1 nm, or between about 1 nm and about 2 nm.

In various embodiments, the magnetoelectric device 100a may further include a pinning magnetic layer structure 112 configured to pin the fixed magnetization orientation 101a or 101b of the reference magnetic layer structure 102. The pinning magnetic layer structure 112 may be arranged proximal to or in contact with the reference magnetic layer structure 102.

In various embodiments, the pinning magnetic layer structure 112 may include a magnetic layer 113a antiferromagnetically coupled to the reference magnetic layer structure 102. In this way, the magnetic layer 113a and the reference magnetic layer structure 102 may define a synthetic antiferromagnetic layer structure (SAF), wherein the respective magnetization orientations of the reference magnetic layer structure 102 and the magnetic layer 113a may be aligned anti-parallel to each other. In various embodiments, the magnetic layer 113a may reduce the stray field (e.g., generated by the reference magnetic layer structure 102) on the free magnetic layer structure 104, and to enhance the stability of the reference magnetic layer structure 102.

In various embodiments, the pinning magnetic layer 112 structure may further include a non-magnetic coupling layer (e.g., an interlayer) 113b arranged in between the magnetic layer 113a and the reference magnetic layer structure 102. In this way, the magnetic layer 113a and the reference magnetic layer structure 102 may be antiferromagnetically coupled to each other through the non-magnetic coupling layer 113b. In various embodiments, the non-magnetic coupling layer 113b may facilitate or provide or enable exchange coupling between the magnetic layer 113a and the reference magnetic layer structure 102.

In various embodiments, the pinning magnetic layer 112 structure may further include an antiferromagnetic (AFM) layer 113c associated with the magnetic layer 113a. The antiferromagnetic layer 113c may be arranged proximal to or in contact with the magnetic layer 113a.

In various embodiments, the pinning magnetic layer structure 112 may include a first magnetic layer 114a and a second magnetic layer 114b antiferromagnetically coupled to each other, the first magnetic layer 114a being arranged between the reference magnetic layer structure 102 and the second magnetic layer 114b, wherein the first magnetic layer 114a may be antiferromagnetically coupled to the reference magnetic layer structure 102. In this way, the first magnetic layer 114a, the second magnetic layer 114b and the reference magnetic layer structure 102 may define a double-synthetic antiferromagnetic layer structure (D-SAF), wherein the respective magnetization orientations of the first magnetic layer 114a and the second magnetic layer 114b may be aligned anti-parallel to each other, and wherein the respective magnetization orientations of the first magnetic layer 114a and the reference magnetic layer structure 102 may be aligned anti-parallel to each other. In various embodiments, the first magnetic layer 114a and the second magnetic layer 114b may reduce the stray field (e.g., generated by the reference magnetic layer structure 102) on the free magnetic layer structure 104, and to enhance the stability of the reference magnetic layer structure 102.

In various embodiments, the pinning magnetic layer 112 structure may further include a first non-magnetic coupling layer (e.g., a first interlayer) 114c arranged in between the first magnetic layer 114a and the reference magnetic layer structure 102, and a second non-magnetic coupling layer (e.g., a second interlayer) 114d arranged in between first magnetic layer 114a and the second magnetic layer 114b. In various embodiments, the first non-magnetic coupling layer 114c may facilitate or provide or enable exchange coupling between the first magnetic layer 114a and the reference magnetic layer structure 102, and the second non-magnetic coupling 114d may facilitate or provide or enable exchange coupling between the first magnetic layer 114a and the second magnetic layer 114b.

In various embodiments, the pinning magnetic layer 112 structure may further include an antiferromagnetic (AFM) layer 114e associated with the second magnetic layer 114b. The antiferromagnetic layer 114e may be arranged proximal to or in contact with the second magnetic layer 114b.

In the context of various embodiments, each of the magnetic layer 113a, the first magnetic layer 114a and the second magnetic layer 114b of the pinning magnetic layer structure 112 described above may have a fixed magnetization orientation.

In the context of various embodiments, each of the magnetic layer 113a, the first magnetic layer 114a and the second magnetic layer 114b of the pinning magnetic layer structure 112 described above may be ferrimagnetic or ferromagnetic.

In the context of various embodiments, each of the magnetic layer 113a, the first magnetic layer 114a and the second magnetic layer 114b of the pinning magnetic layer structure 112 described above may include or consist of at least one of the following materials and/or alloys of the materials: chromium (Cr), manganese (Mn), iron (Fe), cobalt (Co), nickel (Ni), boron (B), carbon (C), oxygen (O), nitrogen (N), aluminium (Al), silicon (Si), titanium (Ti), vanadium (V), copper (Cu), zinc (Zn), gallium (Ga), germanium (Ge), zirconium (Zr), niobium (Nb), molybdenum (Mo), palladium (Pd), silver (Ag), antimony (Sb), tellurium (Te), hafnium (Hf), tantalum (Ta), tungsten (W), iridium (Ir), platinum (Pt), gold (Au), magnesium (Mg) or any combination thereof as multilayers (e.g., multilayers of [Co/Pt], multilayers of [Co/Pd], multilayers of [Co/Ni]), or as alloys (e.g., CoPt, CoPd, CoFeBPt), or both (e.g., [Co/Pt]n/Ta/CoFeB).

In the context of various embodiments, each of the magnetic layer 113a, the first magnetic layer 114a and the second magnetic layer 114b of the pinning magnetic layer structure 112 described above may have a thickness in a range of between about 1 nm and about 15 nm, for example, between about 1 nm and about 10 nm, between about 1 nm and about 5 nm, between about 5 nm and about 15 nm, or between about 5 nm and about 10 nm.

In the context of various embodiments, each of the non-magnetic coupling layer 113b, the first non-magnetic coupling layer 114c and the second non-magnetic coupling layer 114d of the pinning magnetic layer structure 112 described above may be a non-magnetic conducting layer.

In the context of various embodiments, each of the non-magnetic coupling layer 113b, the first non-magnetic coupling layer 114c and the second non-magnetic coupling layer 114d of the pinning magnetic layer structure 112 described above may be an ultra thin layer.

In the context of various embodiments, each of the non-magnetic coupling layer 113b, the first non-magnetic coupling layer 114c and the second non-magnetic coupling layer 114d of the pinning magnetic layer structure 112 described above may have a thickness in a range of between about 0.3 nm and about 2 nm, for example, between about 0.3 nm and about 1 nm, between about 0.6 nm and about 2 nm, or between about 1 nm and about 2 nm.

In the context of various embodiments, each of the non-magnetic coupling layer 113b, the first non-magnetic coupling layer 114c and the second non-magnetic coupling layer 114d of the pinning magnetic layer structure 112 described above may include at least one of the elements: ruthenium (Ru), rhodium (Rh), chromium (Cr), vanadium (V), molybdenum (Mo), or any combination thereof, or any alloys of the mentioned elements such as Ru—Ta.

In the context of various embodiments, each of the non-magnetic coupling layer 113b, the first non-magnetic coupling layer 114c and the second non-magnetic coupling layer 114d of the pinning magnetic layer structure 112 described above may possess an interlayer magnetic coupling mechanism such as, but not limited to: Ruderman-Kittel-Kasuya-Yosida (RKKY), or double-exchange or superexchange.

In the context of various embodiments, an antiferromagnetic (AFM) layer (e.g., 113c, 114e) may include a material including X-manganese or X—Y-manganese, wherein each of X and Y includes but not limited to platinum (Pt), palladium (Pd), iridium (Ir), rhodium (Rh), nickel (Ni), ruthenium (Ru) or iron (Fe), or a material including nickel oxide (NiO).

In the context of various embodiments, an antiferromagnetic (AFM) layer (e.g., 113c, 114e) may enhance the pinning stability of the reference magnetic layer structure (e.g., 102) and reduce the stray field from the reference magnetic layer structure and the pinning magnetic layer structure (e.g., 112) on the free magnetic layer structure (e.g., 104).

In the context of various embodiments, an antiferromagnetic (AFM) layer (e.g., 113c, 114e) may have a thickness in a range of between about 5 nm and about 30 nm, for example, between about 5 nm and about 20 nm, between about 5 nm and about 10 nm, between about 10 nm and about 30 nm, or between about 10 nm and about 20 nm.

In various embodiments, the magnetoelectric device 100a may further include a magnesium oxide (MgO) layer in contact with the coupling magnetic layer structure 106. The coupling magnetic layer structure 106 may be arranged in between the magnesium oxide layer and the non-magnetic spacer layer 108.

In various embodiments, the magnetoelectric device 100, 100a may further include a seed layer structure, wherein the reference magnetic layer structure 102 and the synthetic antiferromagnetic layer structure 103 may be arranged over the seed layer structure. The seed layer structure may facilitate the formation or growth of the reference magnetic layer structure 102 and/or the synthetic antiferromagnetic layer structure 103, for example, so as to achieve suitable crystallographic and magnetic properties for the reference magnetic layer structure 102 and/or the synthetic antiferromagnetic layer structure 103.

In various embodiments, the seed layer structure may include a conductive material. The seed layer structure may include one or more layers including a material including but not limited to any one of or a combination of tantalum (Ta), palladium (Pd), platinum (Pt), ruthenium (Ru), hafnium (Hf), chromium (Cr), nickel (Ni), tungsten (W), aluminum (Al), molybdenum (Mo), iron (Fe), titanium (Ti), silver (Ag), or gold (Au).

In various embodiments, the magnetoelectric device 100, 100a may further include a capping layer structure, wherein the capping layer structure may be arranged over the reference magnetic layer structure 102 and the synthetic antiferromagnetic layer structure 103.

In various embodiments, the capping layer structure may include a conductive material. The capping layer structure may include one or more layers including a material including but not limited to any one of or a combination of tantalum (Ta), palladium (Pd), platinum (Pt), ruthenium (Ru), hafnium (Hf), chromium (Cr), nickel (Ni), tungsten (W), aluminum (Al), molybdenum (Mo), titanium (Ti), silver (Ag), gold (Au), carbon (C), nitrogen (N) or hydrogen (H).

In various embodiments, the reference magnetic layer structure 102 and the synthetic antiferromagnetic layer structure 103 may be arranged between the seed layer structure and the capping layer structure.

In the context of various embodiments, the capping layer structure and the seed layer structure may be configured or used as electrodes (e.g. top and bottom (or first and second) electrodes respectively), or separate metal electrodes may be formed or provided on the capping layer structure and the seed layer structure respectively.

In the context of various embodiments, the magnetoelectric device 100, 100a may have perpendicular magnetic anisotropy (PMA), for example as illustrated in FIG. 1A. Each of the reference magnetic layer structure 102, the free magnetic layer structure 104 and the coupling magnetic layer structure 106 may have perpendicular magnetic anisotropy (PMA). This may mean that the magnetization orientation 101a or 101b or the magnetization easy axis of the reference magnetic layer structure 102 may be at least substantially perpendicular to the plane of a major surface of the reference magnetic layer structure 102, the magnetization orientation 105 or the magnetization easy axis of the free magnetic layer structure 104 may be at least substantially perpendicular to the plane of a major surface of the free magnetic layer structure 104, and the magnetization orientation 107 or the magnetization easy axis of the coupling magnetic layer structure 106 may be at least substantially perpendicular to the plane of a major surface of the coupling magnetic layer structure 106. In other words, the respective magnetization orientations 101a or 101b, 105, 107 of the reference magnetic layer structure 102, the free magnetic layer structure 104 and the coupling magnetic layer structure 106 may be at least substantially parallel to a thickness direction (as represented by the double-headed arrow 109) of at least one of the reference magnetic layer structure 102, the free magnetic layer structure 104 or the coupling magnetic layer structure 106 (or thickness direction of the magnetoelectric device 100, 100a). In the context of various embodiments, the term "magnetization easy axis" may mean an energetically favorable direction of spontaneous magnetization as a result of magnetic anisotropy. The magnetization orientation of a magnetic layer may be aligned along the magnetization easy axis.

FIG. 1C shows a flow chart 140 illustrating a method for forming a magnetoelectric device, according to various embodiments.

At 141, a reference magnetic layer structure having a fixed magnetization orientation is formed.

At 143, a synthetic antiferromagnetic layer structure is formed, the synthetic antiferromagnetic layer structure including a free magnetic layer structure and a coupling magnetic layer structure antiferromagnetically coupled to each other, each of the free magnetic layer structure and the coupling magnetic layer structure having a magnetization orientation that is variable, wherein the reference magnetic layer structure and the synthetic antiferromagnetic layer structure are arranged one over the other.

In various embodiments, the reference magnetic layer structure may be formed before or after forming the synthetic antiferromagnetic layer structure.

In various embodiments, a magnetic moment of the free magnetic layer structure may be more than a magnetic moment of the coupling magnetic layer structure.

FIG. 1D shows a flow chart 145 illustrating a writing method for a magnetoelectric device, according to various embodiments. The magnetoelectric device may include a reference magnetic layer structure having a fixed magnetization orientation, and a synthetic antiferromagnetic layer structure including a free magnetic layer structure and a coupling magnetic layer structure antiferromagnetically coupled to each other.

At 146, a resistance state of the magnetoelectric device may be determined. The resistance state of the magnetoelectric device may be dependent on the state or direction of the magnetization orientation of the free magnetic layer structure relative to the fixed magnetization orientation of the reference magnetic layer structure, for example, whether the respective magnetization orientations are parallel (P) or anti-parallel (AP) to each other.

At 148, after determining the resistance state, a voltage may be applied (to or across the magnetoelectric device) to vary a magnetization orientation of a free magnetic layer structure of the magnetoelectric device from a first direction to a second direction different from the first direction, and to vary a magnetization orientation of a coupling magnetic layer structure of the magnetoelectric device from the second direction to the first direction, the free magnetic layer structure and the coupling magnetic layer structure being antiferromagnetically coupled to each other. The first direction and the second direction may be opposite directions.

In various embodiments, the voltage may include a voltage pulse.

In various embodiments, at 148, only the voltage may be applied to vary the respective magnetization orientations of the free magnetic layer structure and the coupling magnetic layer structure.

In various embodiments, the method may further include, after applying the voltage at 148, applying an additional voltage (e.g., another voltage pulse) or only an additional voltage to vary the magnetization orientation of the free magnetic layer structure from the second direction to the first direction, and to vary the magnetization orientation of the coupling magnetic layer structure of the magnetoelectric device from the first direction to the second direction, the voltage and the additional voltage having a same polarity. In various embodiments, the voltage and the additional voltage may have the same magnitude.

In various embodiments, the free magnetic layer structure may not be subjected to at least one of spin-transfer torque effect or a magnetic field when applying the voltage to vary the magnetization orientation of the free magnetic layer structure from the first direction to the second direction. This may similarly be applicable when applying the additional voltage.

In the context of various embodiments, the free magnetic layer structure (e.g., 104) and the coupling magnetic layer structure (e.g., 106) may be antiferromagnetically coupled to each other by exchange coupling. In other words, the free magnetic layer structure and the coupling magnetic layer structure may be exchanged coupled or exchange biased to each other, resulting in the free magnetic layer structure and the coupling magnetic layer structure being antiferromagnetically coupled to each other. In the context of various embodiments, the term "exchange coupling" as applied with regard to the free magnetic layer structure and the coupling magnetic layer structure may mean that the magnetization orientation of the free magnetic layer structure (or the coupling magnetic layer structure) may be varied or changed in sync with a change in the magnetization orientation of the coupling magnetic layer structure (or the free magnetic layer structure) such that the free magnetic layer structure and the coupling magnetic layer structure are antiferromagnetically coupled to each other.

In the context of various embodiments, the magnetoelectric device (e.g., 100, 100a) may be or may include a magnetoelectric non-volatile memory.

In the context of various embodiments, the magnetoelectric device (e.g., 100, 100a) or the magnetoelectric non-volatile memory may be voltage-controlled.

In the context of various embodiments, the magnetoelectric device (e.g., 100, 100a) may be or may include a magnetoresistive random-access memory (MRAM).

Various embodiments may relate to a method of switching the magnetization of a free magnetic layer structure (or free layer) with perpendicular magnetic anisotropy using an electric field. This method may be implemented in a magnetoresistive random-access memory (MRAM). Various embodiments do not require any applied magnetic field and spin-transfer torque.

Figures 2A, 2B:
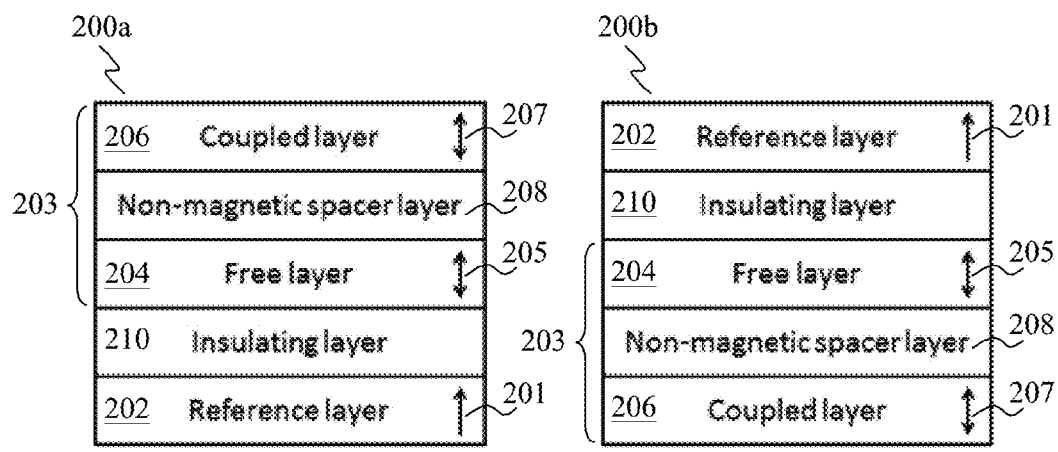
FIGS. 2A to 2C show schematic cross-sectional views of a magnetoelectric device, according to various embodiments.
Figure 2C:
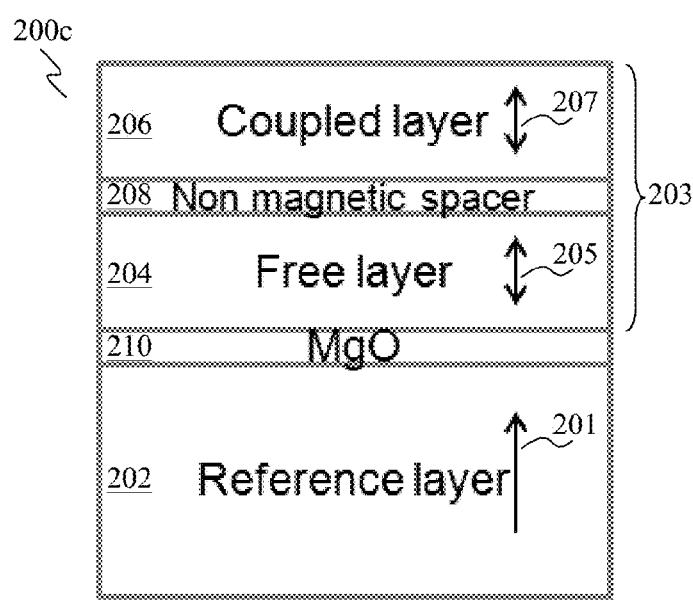

FIGS. 2A to 2C show schematic cross-sectional views of a magnetoelectric device 200a, 200b, 200c, or a magnetic tunnel junction (MTJ) of a magnetoelectric device 200a, 200b, 200c, according to various embodiments. Each MTJ or magnetoelectric device 200a, 200b, 200c may include a coupling magnetic layer structure (or coupled layer; ferromagnetic coupled layer; CL) 206, a non-magnetic spacer layer 208, a free magnetic layer structure (or free layer; ferromagnetic free layer; FL) 204, an insulating layer (or non-magnetic insulating layer) 210, e.g., a magnesium oxide (MgO) layer, and a reference magnetic layer structure (or reference layer; ferromagnetic reference layer; RL) 202. The coupling magnetic layer structure 206 is magnetically coupled to the free magnetic layer structure 204, for example, the free magnetic layer structure 204 and the coupling magnetic layer structure 206 are antiferromagnetically coupled to each other, for example, through the non-magnetic spacer layer 208. The reference magnetic layer structure 202 may be a single reference layer. FIGS. 2A to 2C show different embodiments where materials growth may start from the reference magnetic layer structure 202 or from the coupling magnetic layer structure 206.

For simplicity, additional layer(s) pertaining to fabrication process requirements, reference layer stability and stray field control at the FL or connection to outer electrodes are not shown in FIGS. 2A to 2C, but nevertheless may be present. Seed layer structure (or seed layer) or capping layer structure (capping layer) are also not shown in FIGS. 2A to 2C, but nevertheless may be present.

Each magnetoelectric device 200a, 200b, 200c may have perpendicular magnetic anisotropy (PMA). This may mean, for example, that all ferromagnetic layers (e.g., reference magnetic layer structure 202, free magnetic layer structure 204 and coupling magnetic layer structure 206) may possess perpendicular magnetic anisotropy (PMA). Magnetizations or magnetization orientations of the reference magnetic layer structure 202, the free magnetic layer structure 204 and the coupling magnetic layer structure 206 may be are out of the layers' planes, for example corresponding to planes of the layers' respective major surfaces. The reference magnetic layer structure 202 may have a fixed magnetization orientation (as represented by the single-headed arrow 201 representing a typical orientation of the magnetization of the reference magnetic layer structure 202), for example, fixed in an upwardly direction. Each of the free magnetic layer structure 204 and the coupling magnetic layer structure 206 may have a variable magnetization orientation (as represented by the double-headed arrows 205, 207) that may point in an upwardly direction or a downwardly direction. The double-headed arrows 205, 207 represent the orientations of the magnetizations of each of the free magnetic layer structure 204 and the coupling magnetic layer structure 206 and indicate that both of these layers' magnetization orientations may be changed during a write operation.

The reference magnetic layer structure 202 may possess a strong perpendicular uniaxial magnetic anisotropy which may prevent it from being affected by external and internal magnetic perturbations. The perpendicular magnetic anisotropy of the free magnetic layer structure 204 may have its source at least partially from the interface with the insulating layer 210 (also known as interfacial magnetic anisotropy) so that its magnetic anisotropy may be tuned by an electric field (E-field). The material for the free magnetic layer structure 204 should have high spin polarization to have high TMR in the MTJ devices 200a, 200b, 200c.

The free magnetic layer structure 204, the non-magnetic spacer layer 208 and the coupling magnetic layer structure 206 constitute or define a synthetic anti-ferromagnet (SAF) structure 203. Due to the antiferromagnetic coupling, the moments or magnetization orientations 205, 207 of the free magnetic layer structure 204 and the coupling magnetic layer structure 206 may point in opposite direction in the absence of an applied field.

The non-magnetic spacer layer 208 may include at least one of the elements: ruthenium (Ru), rhodium (Rh), chromium (Cr), vanadium (V), molybdenum (Mo), or combinations and alloys of these such as ruthenium-tantalum (Ru—Ta). The thickness range of the non-magnetic spacer layer 208 may be 3-20 angstroms (or 0.3-2 nm), depending upon the coupling peak of the material used.

In various embodiments, it may be desirable to have a slight magnetic imbalanced SAF structure 203, which may cause the magnetization to fall into a preferred state upon application of an electric field. An imbalance may be accomplished by having $M_{s1} \times t_1 > M_{s2} \times t_2$, where $M_{s1}$ and $t_1$ are the saturation magnetization and thickness, respectively, of the free magnetic layer structure 204, and $M_{s2}$ and $t_2$ are the saturation magnetization and thickness, respectively, of the coupling magnetic layer structure 206.

It is appreciated that in various embodiments, the damping factor of the free magnetic layer structure 204 does not play a critical role in the overall energy consumption to switch a cell (e.g., a memory cell), as opposed to conventional devices which use the spin transfer torque (STT) effect to switch.

In various embodiments, no in-plane magnetic field is required for switching the magnetization orientation 205 of the free magnetic layer structure 204.

FIGS. 3A to 3D show schematic cross-sectional views of a magnetoelectric device 300a, 300b, 300c, 300d, or a magnetic tunnel junction (MTJ) of a magnetoelectric device 300a, 300b, 300c, 300d, according to various embodiments. Like features or components of the magnetoelectric device 300a, 300b, 300c, 300d that are similarly present in the magnetoelectric device 200a, 200b, 200c are denoted by like reference numerals increased by 100, and which may be as correspondingly described in the context of the magnetoelectric device 200a, 200b, 200c and therefore are omitted here.

Figure 3A:
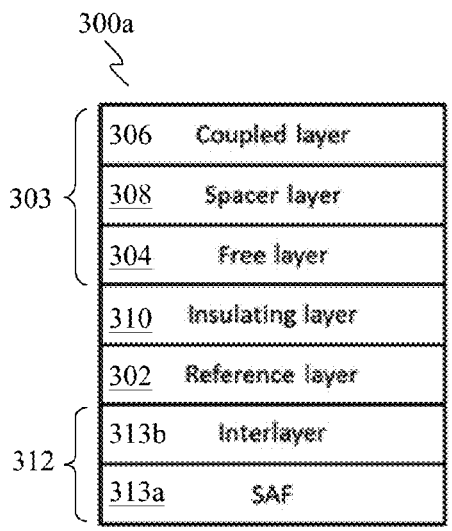
FIGS. 3A to 3D show schematic cross-sectional views of a magnetoelectric device, according to various embodiments.
Figure 3B:
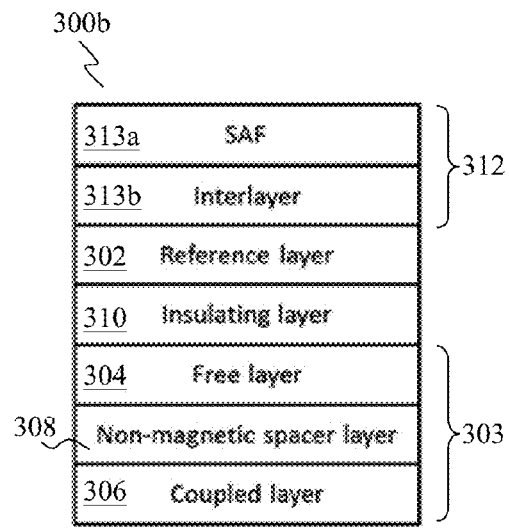
Figure 3C:
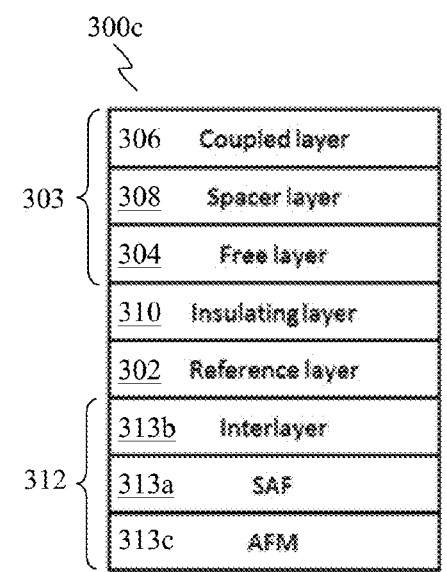
Figure 3D:
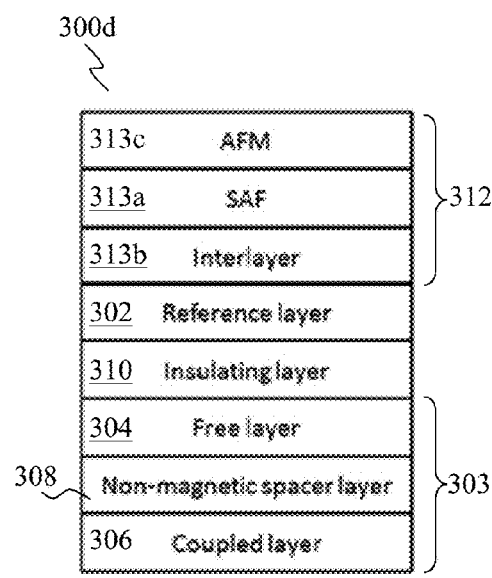
Figure 4A:
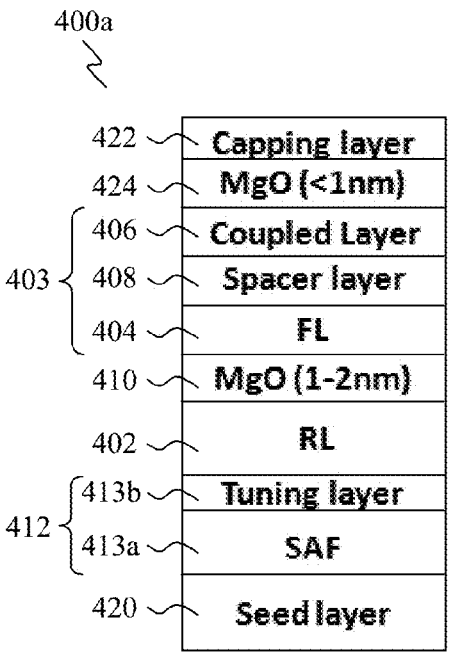
FIGS. 4A to 4H show schematic cross-sectional views of a magnetoelectric device, according to various embodiments.
Figure 4B:
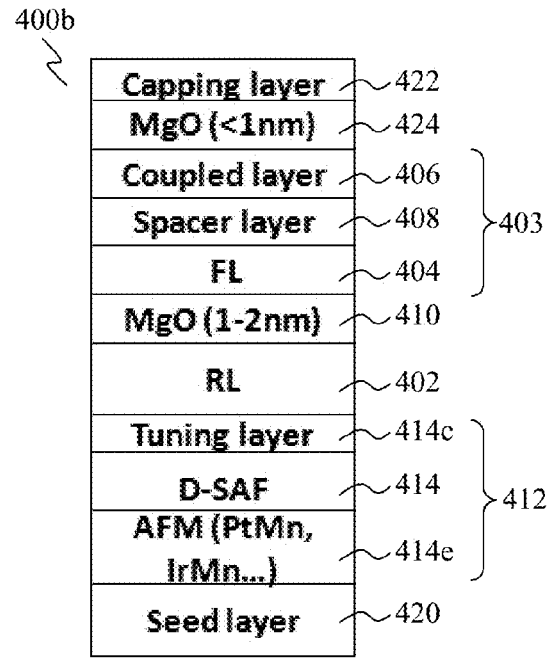
Figure 4C:
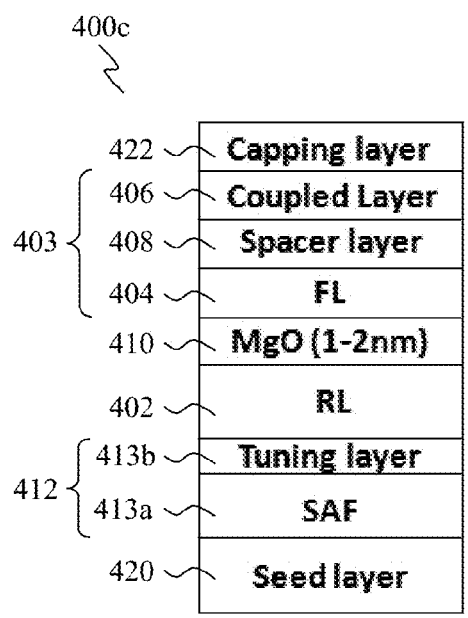
Figure 4D:
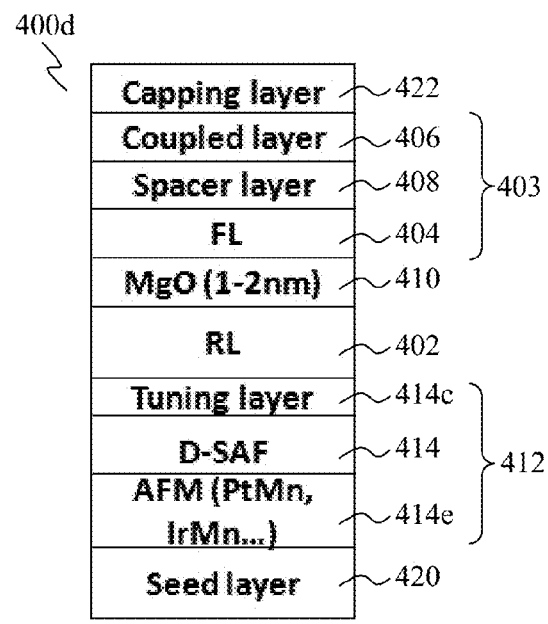
Figure 4E:
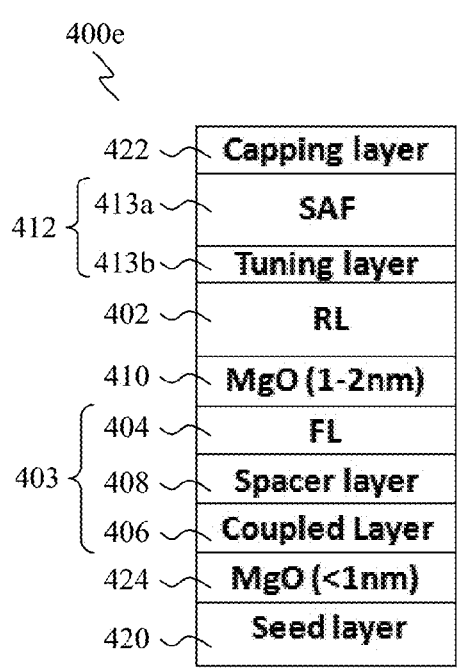
Figure 4F:
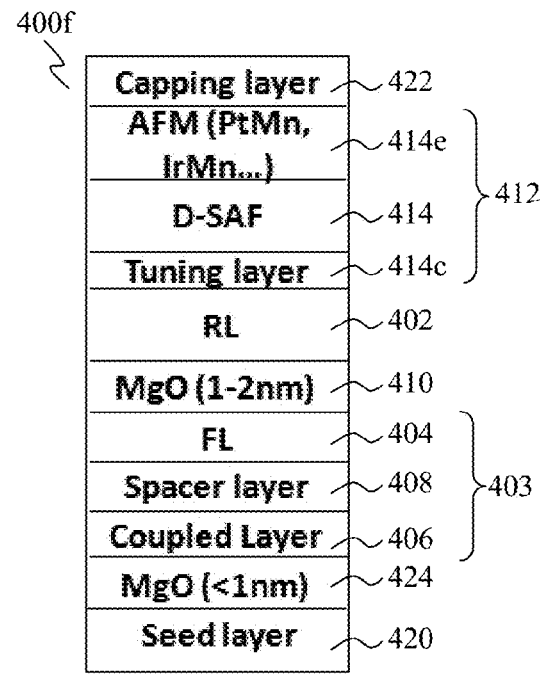
Figure 4G:
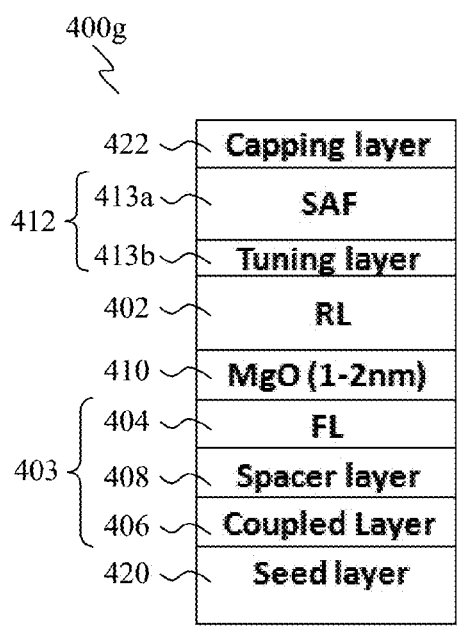
Figure 4H:
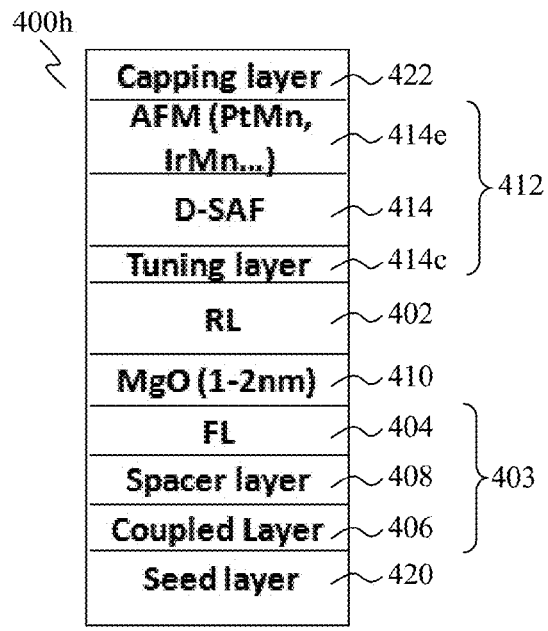

The magnetoelectric device 300a, 300b, 300c, 300d may be similar to the magnetoelectric device 200a, 200b, 200c except that the reference magnetic layer structure 302 is pinned using a simple synthetic antiferromagnetic (SAF) structure (FIGS. 3A and 3B) or an AFM pinned SAF structure (FIGS. 3C and 3D). For example, the single reference layer 202 may be replaced with a SAF structure and an AFM pinned SAF structure in a bottom pinned stack (FIGS. 3A and 3C) or a top pinned stack (FIGS. 3B and 3D). For simplicity, seed layer structure or capping layer structure are not shown in FIGS. 3A to 3D, but nevertheless may be present.

The magnetoelectric device 300a, 300b, 300c, 300d may further include a pinning magnetic layer structure 312 arranged proximate or in contact with the reference magnetic layer structure 302. The pinning magnetic layer structure 312 may include a magnetic layer 313a (indicated as a SAF layer) and a non-magnetic coupling layer (or interlayer) 313b. The non-magnetic coupling layer 313b may be arranged in between the magnetic layer 313a and the reference magnetic layer structure 302. The magnetic layer 313a and the reference magnetic layer structure 302 may be antiferromagnetically coupled to each other. The magnetic layer 313a, the non-magnetic coupling layer 313b and the reference magnetic layer structure 302 may define an SAF structure.

The pinning magnetic layer structure 312 of the magnetoelectric device 300c, 300d may further include an antiferromagnetic (AFM) layer 313c. The AFM layer 313c may be arranged in contact with the magnetic layer 313a. The AFM layer 313c may pin or fix the magnetization orientation of the magnetic layer 313a. The AFM pinned SAF structure 312 of the magnetoelectric device 300c, 300d may effectively reduce the stray magnetic field on the free magnetic layer structure 304 to almost zero and enhance the stability of the reference magnetic layer structure 302.

The non-magnetic coupling layer (or interlayer) 313b may be or may include an ultra-thin metal which may enable antiferromagnetic coupling of the reference magnetic layer structure 302 and the SAF layer 313a with differing crystalline lattices, and may include at least one of the elements: ruthenium (Ru), rhodium (Rh), chromium (Cr), vanadium (V), molybdenum (Mo), or combinations and alloys of these such as ruthenium-tantalum (Ru—Ta).

FIGS. 4A to 4H show schematic cross-sectional views of a magnetoelectric device 400a, 400b, 400c, 400d, 400e, 400f, 400g, 400h, or a magnetic tunnel junction (MTJ) of a magnetoelectric device 400a, 400b, 400c, 400d, 400e, 400f, 400g, 400h, according to various embodiments. Like features or components of the magnetoelectric device 400a, 400b, 400c, 400d, 400e, 400f, 400g, 400h that are similarly present in the magnetoelectric device 300a, 300b, 300c, 300d are denoted by like reference numerals increased by 100, and which may be as correspondingly described in the context of the magnetoelectric device 300a, 300b, 300c, 300d and therefore are omitted here. The insulating layer 410 may be a magnesium oxide (MgO) layer with a thickness of about 1-2 nm. The tuning layer (or interlayer) 413b, 414c may be a non-magnetic coupling layer and may be as described in the context of the non-magnetic coupling layer 313b of the magnetoelectric devices 300a, 300b, 300c, 300d.

For the magnetoelectric device 400a, 400b, 400c, 400d, the synthetic anti-ferromagnet (SAF) structure 403 may be arranged over the reference magnetic layer structure 402, while for the magnetoelectric device 400e, 400f, 400g, 400h, the reference magnetic layer structure 402 may be arranged over the synthetic anti-ferromagnet (SAF) structure 403.

The coupling magnetic layer structure 406, the free magnetic layer structure 404, and the reference magnetic layer structure 402 may be ferromagnetic layers with perpendicular magnetic anisotropy (PMA). The free magnetic layer structure 404 may have strong modulation of its perpendicular magnetic anisotropy under application of an E-field (also referred to as a "strong E-field effect") and high spin polarization. The reference magnetic layer structure 402 may have high polarization. The non-magnetic spacer layer 208 may include non-magnetic materials such as Ru, Cr, Cu, Ta, providing exchange coupling between the free magnetic layer structure 404 and the coupling magnetic layer structure 406.

The magnetoelectric device 400a, 400b, 400c, 400d may have a bottom pinned stack or structure while the magnetoelectric device 400e, 400f, 400g, 400h may have a top pinned stack or structure.

For the magnetoelectric device 400b, 400d, 400f, 400h, the pinning magnetic layer structure 412 may include a first magnetic layer and a second magnetic layer, with a non-magnetic coupling layer sandwiched therebetween. The first magnetic layer may be arranged in between the reference magnetic layer structure 402 and the second magnetic layer, such that the first magnetic layer may be arranged proximal to the reference magnetic layer structure 402 while the second magnetic layer may be arranged distal to the reference magnetic layer structure 402. The first magnetic layer and the reference magnetic layer structure 402 may be antiferromagnetically coupled to each other. The first magnetic layer and the second magnetic layer may be antiferromagnetically coupled to each other. The first magnetic layer, the second magnetic layer and the non-magnetic coupling layer are collectively indicated as a D-SAF (double-SAF) layer 414. The first magnetic layer and the second magnetic layer of the D-SAF layer 414 and the reference magnetic layer structure 402 may define a D-SAF structure such that the first magnetic layer of the D-SAF layer 414, the second magnetic layer of the D-SAF layer 414 and the reference magnetic layer structure 402 may be antiferromagnetically coupled to each other. The pinning magnetic layer structure 412 may further include a non-magnetic coupling layer (or tuning layer, or interlayer) 414c arranged in between the reference magnetic layer structure 402 and the D-SAF layer 414.

The pinning magnetic layer structure 412 of the magnetoelectric device 400b, 400d, 400f, 400h may further include an antiferromagnetic (AFM) layer 414e. The AFM layer 414e may be arranged in contact with the second magnetic layer of the D-SAF layer 414. The AFM layer 414e may pin or fix the magnetization orientation of the second magnetic layer of the D-SAF layer 414.

Each of the magnetoelectric device 400a, 400b, 400c, 400d, 400e, 400f, 400g, 400h may further include a seed layer structure (or seed layer) 420 and a capping layer structure 422, where the synthetic anti-ferromagnet (SAF) structure 403 and the reference magnetic layer structure 402 may be arranged over the seed layer structure 420, and in between the seed layer structure 420 and the capping layer structure 422. The seed layer structure 420 and/or the capping layer structure 422 may include one or more conductive materials such as tantalum (Ta), ruthenium (Ru), hafnium (Hf), etc.

In various embodiments, each of the magnetoelectric device 400a, 400b, 400e, 400f, may further include a magnesium oxide (MgO) layer 424 in contact with the coupling magnetic layer structure 406. The MgO layer 424 may have a thickness of less than about 1 nm. In various embodiments, the MgO layer 424 may be used to provide perpendicular anisotropy to the coupling magnetic layer structure 406.

In various embodiments, the MgO layer 424 on top of or in contact with the coupling magnetic layer structure 406 may be removed if only the coupling magnetic layer structure 406 has PMA, as illustrated in FIGS. 4C, 4D, 4G, 4H for the magnetoelectric device 400c, 400d, 400g, 400h. For the magnetoelectric device 400c, 400d, 400g, 400h, the coupling magnetic layer structure 406 may be composed of multilayers, e.g., (Co/Pt), (Co/Pd) and (Co/Ni) multilayers, or single layer such as CoFeB, FePt and CoPt alloys.

In the context of various embodiments, all layers except the insulating layer (e.g., 110, 210, 310, 410) may be metallic, meaning that their conductivity follows Ohm's law. The insulating layer may be formed of a material which has a non-zero electronic gap; it is thin enough such that applying a voltage across its boundaries may result in direct or sequential tunneling of carriers. It is thick enough so that during operation of an MRAM of various embodiments, spin-transfer torque may be negligible and does not play a significant role in switching the magnetization of the free magnetic layer structure (e.g., 103, 204, 304, 404). The insulating layer may include or consist essentially of MgO, AlO, $HfO_2$, $Ta_2O_5$ or any combination thereof, with a thickness range of about 1 nm-2.5 nm.

In the context of various embodiments, using a magnetoresistive random-access memory (MRAM) as a non-limiting example of the magnetoelectric device of various embodiments, applying a reading voltage (e.g., a voltage pulse) across the MRAM may result in a current which may depend on the relative orientation of the magnetization directions or orientations of the free magnetic layer structure (or free layer; FL) and the reference magnetic layer structure (or reference layer; RL) through tunneling magnetoresistance. Applying a writing voltage (e.g., a voltage pulse) may result in the modulation of at least the perpendicular magnetic anisotropy of at least the free magnetic layer structure or the reference magnetic layer structure. Since the reference magnetic layer structure has a strong perpendicular anisotropy, it is not affected by the modulation in first approximation. The perpendicular magnetic anisotropy of the free magnetic layer structure is either enhanced or reduced depending on the polarity of the applied voltage.

In various embodiments, applying a voltage pulse of a polarity which reduces the perpendicular magnetic anisotropy of the free magnetic layer structure across a magnetic tunnel junction (MTJ) having at least the structure as described herein, for example, the structures as shown in FIGS. 2A to 2C and 3A to 3D, may result in a temporary reduction of the perpendicular magnetic anisotropy of the free magnetic layer structure, which in turn may result in the reorientation of the magnetization orientation of the free magnetic layer structure in the plane (e.g., plane of major surface) of the free magnetic layer structure. In other words, when a voltage pulse is applied across the stack or structure with the correct polarity, the perpendicular magnetic anisotropy may be reduced and the magnetization orientation of the free magnetic layer structure may turn in plane.

As the magnetization of the coupling magnetic layer structure (or coupled layer; CL) is antiferromagnetically coupled to the magnetization of the free magnetic layer structure, but retains its perpendicular magnetic anisotropy during the voltage pulse, the magnetization orientation of the coupling magnetic layer structure is pulled by the free magnetic layer structure and switches, for example, to the opposite direction compared to its initial direction. This flop behavior is a feature of a synthetic antiferromagnetic layer structure (or SAF structure) with a well-defined magnetic anisotropy, and depends on the interplay of the anti-ferromagnetic coupling strength, uniaxial anisotropy and Ms×t (where $M_s$=saturation magnetization and t=thickness) of the free magnetic layer structure and the coupling magnetic layer structure.

During the voltage pulse, after the initial flop is finished and the magnetization orientation of the coupling magnetic layer structure has switched to the opposite direction, the free magnetic layer structure may remain close to the in-plane direction. It is stabilized against external magnetic fields and thermal fluctuations by the antiferromagnetic coupling with the coupling magnetic layer structure.

Once the voltage pulse is over, meaning that no voltage pulse is applied, the free magnetic layer structure may regain its perpendicular magnetic anisotropy and may realign its magnetization antiferromagnetically with the coupling magnetic layer structure, and therefore may switch to the direction opposite to its initial direction before the voltage pulse. In other words, when the voltage pulse is over, the magnetization orientation of the free magnetic layer structure may recover its perpendicular direction and may reorient itself in the opposite direction, as a result of the coupling with the coupling magnetic layer structure.

Applying a second identical voltage pulse may result in the same mechanism and the magnetization orientation of the free magnetic layer structure as well as the magnetization orientation of the coupling magnetic layer structure may switch back to their initial directions. In this way, toggle switching between the bistable magnetization states of the free magnetic layer structure may be realized using only unipolar voltage pulses, as opposed to bipolar voltage pulses.

In various embodiments, no in-plane magnetic field is required for switching the magnetization orientations of the free magnetic layer structure.

In various embodiments, a pulse duration of the voltage pulse may be any duration longer than about 0.5 ns (based on the simulation parameters which will be described below). However, it should be appreciated that the pulse duration may be shorter upon optimization.

In order to evaluate the magnetic junction or the magnetoelectric device of various embodiments, a series of simulations may be performed using OOMMF (Object Oriented Micro Magnetics Framework, which is a software for micromagnetics simulations). The model for the simulations (modelled system) is as described in FIG. 5, which illustrates a schematic representation of the model simulated in OOMMF, as well as all the parameters used in the simulations, for a 40×40 nm$^2$ MTJ (magnetic tunnel junction) 500. The MTJ 500 includes, in sequence, a reference magnetic layer structure (or reference layer (RL)) 502, an insulating layer (e.g., a tunnel barrier, e.g., MgO) 510, a free magnetic layer structure (or free layer (FL)) 504, a non-magnetic spacer layer (e.g., ruthenium, Ru) 508, and a coupling magnetic layer structure (or coupled layer (CL)) 506, where each layer has a thickness of about 1 nm. The parameters indicated are a (damping), M (saturation magnetization), K (perpendicular magnetic anisotropy) and E (interlayer exchange coupling strength). The spin transfer torque and thermal activation are not included in the model. The parameters and their values indicated in FIG. 5 are used as non-limiting examples, and fabricated devices may not be limited to these parameters (and their associated values).

Figure 5:
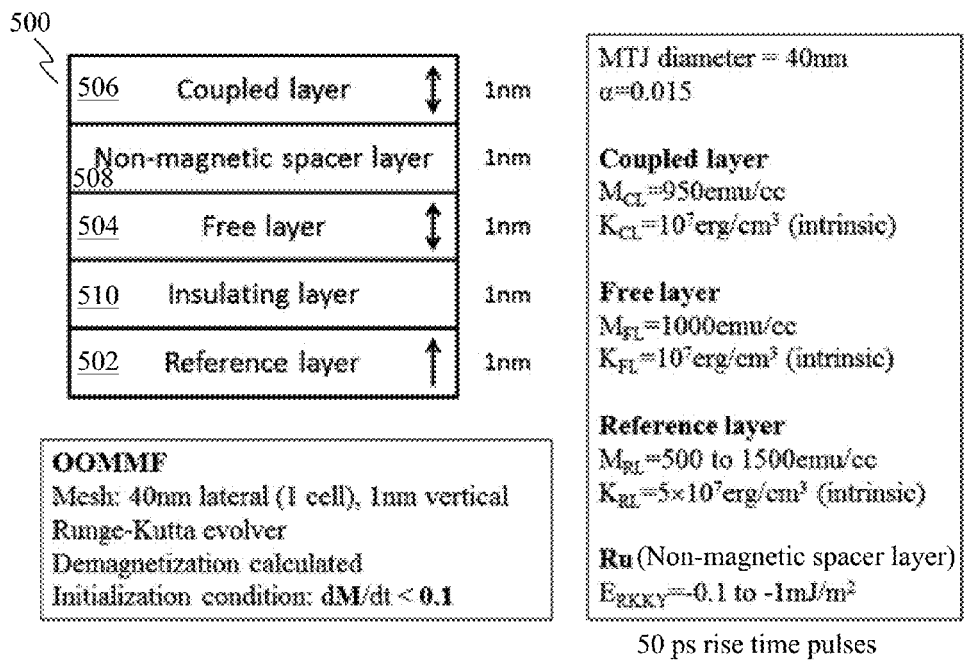
FIG. 5 shows a schematic representation of a simulation model and the associated parameters.
Figures 6A, 6B:
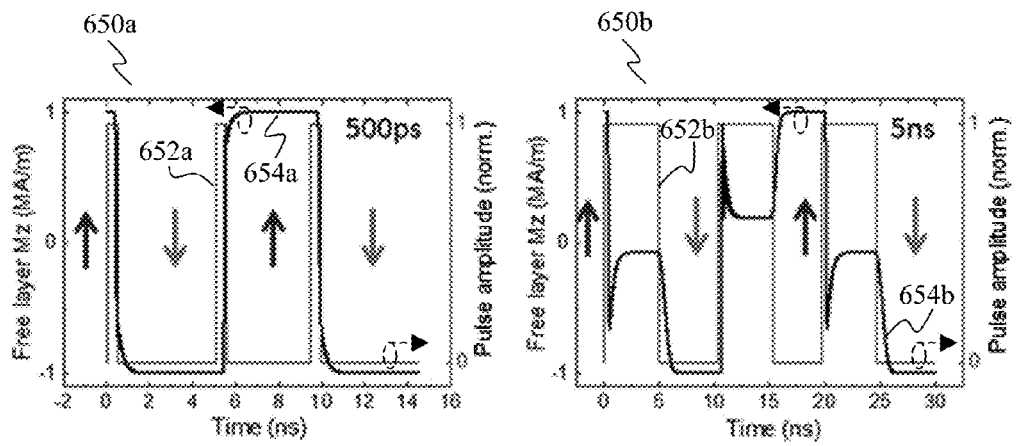
FIGS. 6A and 6B show plots of micromagnetics simulation results using Object Oriented Micro Magnetics Framework (OOMMF) for the modulation of the perpendicular magnetic anisotropy of the free layer (FL) by respective trains of voltage pulses of different pulse durations.

Based on the details for simulation as shown in FIG. 5, the effect of a train of voltage pulses, which may modulate the perpendicular magnetic anisotropy of the free layer (FL) 504 from its equilibrium value to 0, has been simulated for pulses durations between about 500 ps to about 5 ns, and the results of simulations using OOMMF for pulses having a duration of about 500 ps are shown in the plot 650a of FIG. 6A and for pulses having a duration of about 5 ns are shown in the plot 650b of FIG. 6B. The repetition rate of the pulses has been set to the minimum time required for the system (or magnetic tunnel junction) to relax to equilibrium.

In the plots 650a, 650b, the data represented by the continuous lines 652a, 652b represent the pulses, and are associated with the right axis representing the normalized amplitude of a voltage pulse applied (where a value of 0 is equivalent to the amplitude of the magnetic anisotropy of the free magnetic layer structure 504 being equal to its equilibrium value). The data represented by the continuous lines 654a, 654b refer to the projection of the magnetization of the free magnetic layer structure 504 along the out of plane axis (z) (or growth axis) and are associated with the left axis. The respective arrows shown in plots 650a, 650b represent the direction of switching of the free magnetic layer structure 504 in response to a respective voltage pulse. It may be observed that for both pulse durations of about 500 ps (FIG. 6A) and about 5 ns (FIG. 6B), the magnetization of the free magnetic layer structure 504 may switch from the +z direction to the −z direction and vice versa every time a respective voltage pulse is applied. For both durations of pulses, the magnetization orientation of the free magnetic layer structure 504 may switch from one direction to the other every time a pulse occurs, regardless of the presence of a strong stray field due to the presence of a reference magnetic layer structure 502 without SAF. From the simulation with 5 ns voltage pulses, it may be seen from FIG. 6B that the switching may occur in less than about 500 ps after the pulse starts, as the magnetization orientation of the free magnetic layer structure 504 may stay in the plane after this time, until the end of the pulse. As described above and as shown in FIGS. 6A and 6B, consistent bipolar switching of the magnetization or magnetization orientation of the free magnetic layer structure 504 may be achieved with a unipolar voltage pulse.

FIGS. 7A to 7D show plots 750a, 750b, 750c, 750d of micromagnetics simulation results using Object Oriented Micro Magnetics Framework (OOMMF), illustrating 3-dimensional representation of the coupling magnetic layer structure (or coupled layer (CL)) (e.g., 506) and the free magnetic layer structure (or free layer (FL)) (e.g., 504) magnetization vectors for all times simulated.

Figure 7A:
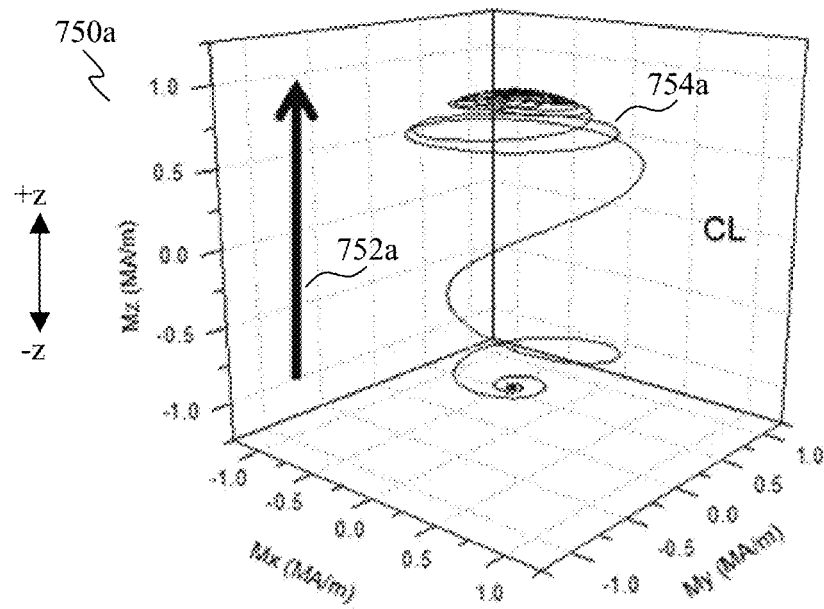
FIGS. 7A to 7D show plots of micromagnetics simulation results using Object Oriented Micro Magnetics Framework (OOMMF).
Figure 7B:
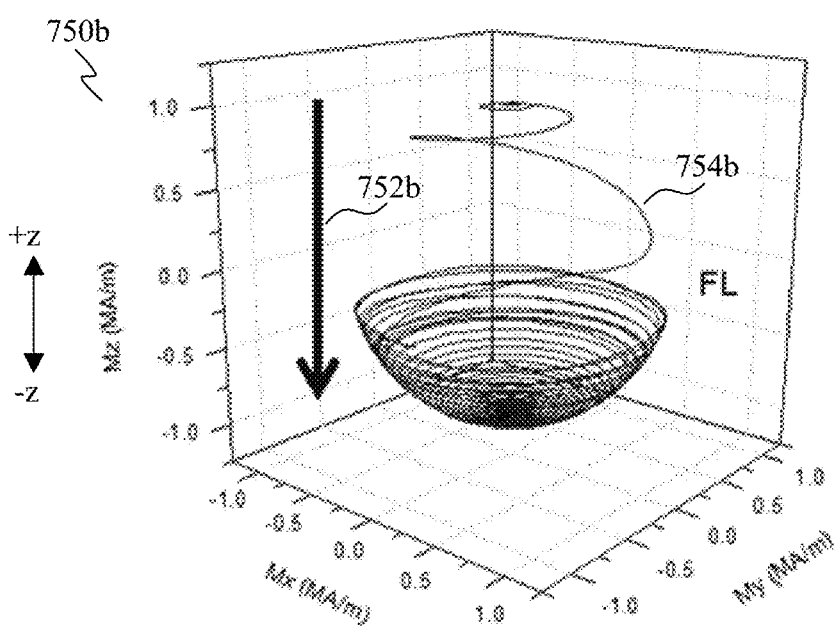
Figure 7C:
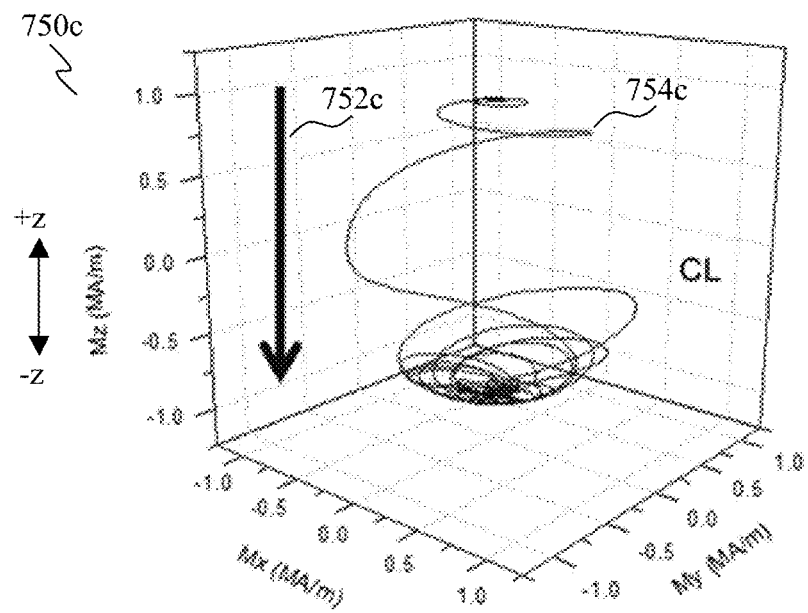
Figure 7D:
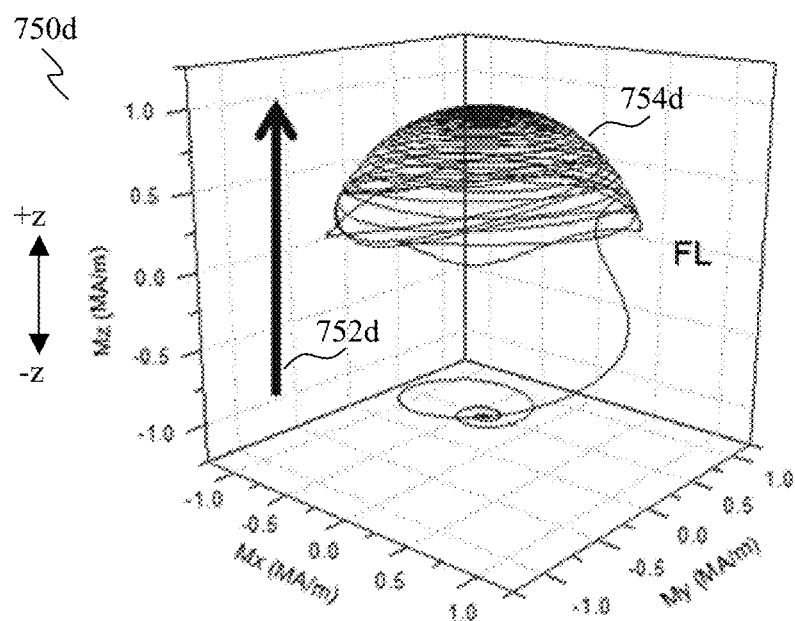

In order to understand the nature of the switching in various embodiments, the magnetization vectors of both the coupling magnetic layer structure (CL) and the free magnetic layer structure (FL), for a 1 ns voltage pulse similar to the ones depicted in FIGS. 6A and 6B, may be plotted for the respective processes corresponding to the switching of the magnetization orientation of the free magnetic layer structure from up to down (see FIGS. 7A and 7B) and the switching of the magnetization orientation of the free magnetic layer structure from down to up (see FIGS. 7C and 7D). The respective arrow 752a, 752c in each respective plot 750a, 750c represents the direction followed by the magnetization of the coupled layer (CL) (e.g. 506) during switching. The respective arrow 752b, 752d in each respective plot 750b, 750d represents the direction followed by the magnetization of the free layer (FL) (e.g., 504) during switching.

FIGS. 7A and 7B show, for a first 1 ns voltage pulse, the respective plots 750a, 750b where the magnetization of the coupling magnetic layer structure (CL) switches from the −z direction to the +z direction (represented by the arrow 752a and the magnetization vector 754a), and where the magnetization of the free magnetic layer structure (FL) switches from the +z direction to the −z direction (represented by the arrow 752b and the magnetization vector 754b), as both the coupling magnetic layer structure and the free magnetic layer structure are coupled antiferromagnetically to each other.

FIGS. 7C and 7D show, for a second 1 ns voltage pulse, the respective plots 750c, 750d where the magnetizations of the coupling magnetic layer structure (CL) and the free magnetic layer structure (FL) switch back to their original relative orientations. In other words, FIG. 7C shows the results where the magnetization orientation of the coupling magnetic layer structure (CL) switches from the +z direction to the −z direction (represented by the arrow 752c and the magnetization vector 754c), while FIG. 7D shows the results where the magnetization orientation of the free magnetic layer structure (FL) switches from the −z direction to the +z direction (represented by the arrow 752d and the magnetization vector 754d), as both the coupling magnetic layer structure and the free magnetic layer structure are coupled antiferromagnetically to each other.

Referring to FIGS. 7A to 7D, the switching mechanism of the magnetizations of both the coupling magnetic layer structure (CL) and the free magnetic layer structure (FL) is precession, as evidenced by the shape of the time dependent magnetization vectors 754a, 754b, 754c, 754d.

Figure 8:
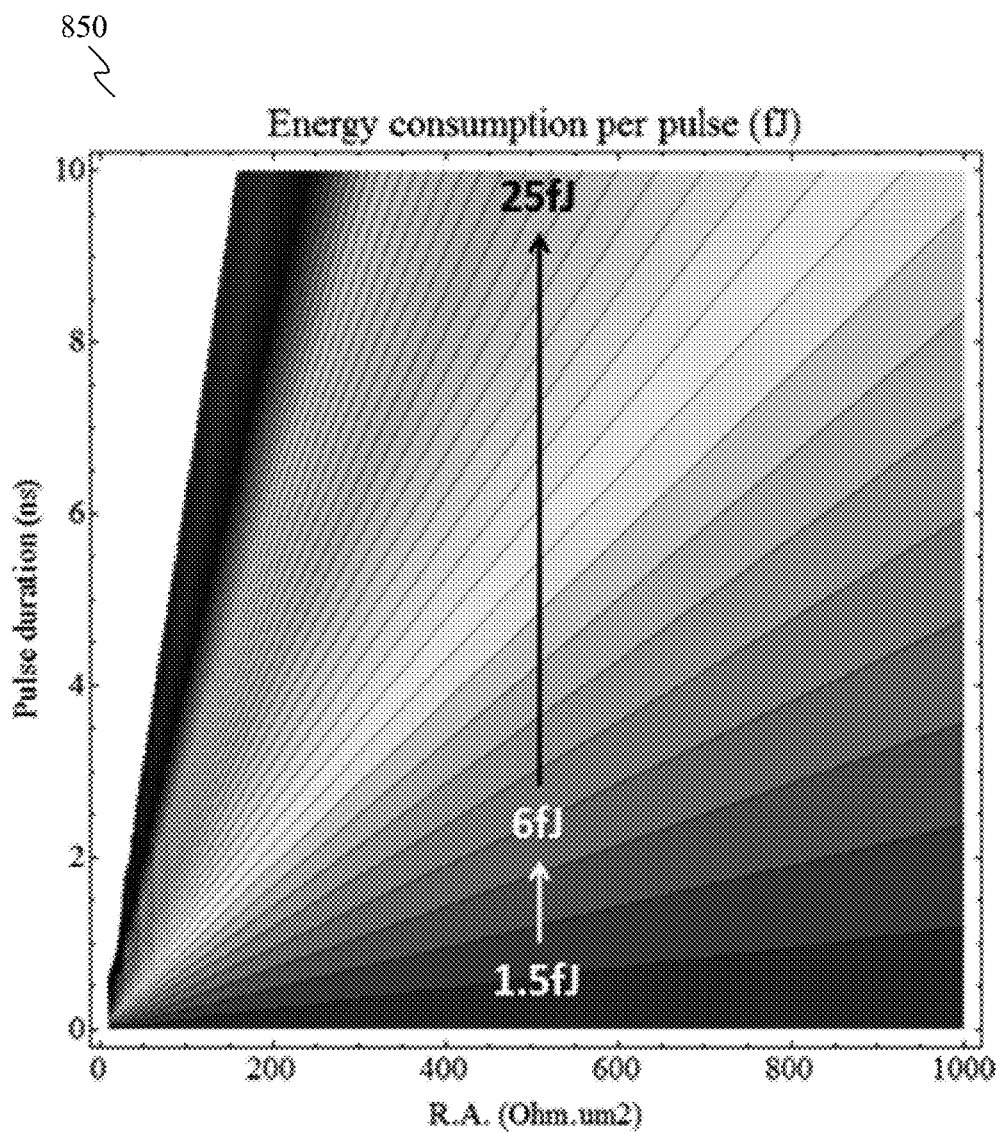
FIG. 8 shows a plot of analytical estimation of the energy consumed to switch the magnetization of the free layer as a function of the duration of the voltage pulse and the resistance-area (RA) product of the insulating layer, according to various embodiments.

Using the same information or data as used for the simulation as described above, the energy consumption that may be required to switch one bit of information may be plotted, as shown in FIG. 8. FIG. 8 shows a plot 850 of analytical estimation of the energy consumed to switch the magnetization of the free magnetic layer structure as a function of the duration of the voltage pulse and the resistance-area (RA) product of the insulating layer, according to various embodiments. As may be observed, any pulse duration above 500 ps (i.e., 0.5 ns) results in deterministic switching of the magnetization of the free magnetic layer structure. Considering an insulating layer with a resistance-area product of about 500 $\Omega \cdot \mu m^2$, bit writing for approximately 1.5 fJ may be achieved for a 40×40 $nm^2$ MTJ (magnetic tunnel junction), which is more than 50-fold reduction compared to the best STT-MRAM result published, to the inventors' knowledge.

As described above, in various embodiments, the magnetic tunnel junction (MTJ) stack may include or consist of at least a reference layer (or reference magnetic layer structure), an insulating layer, a free layer (or free magnetic layer structure), a non-magnetic coupling layer (or non-magnetic spacer layer) and a coupled layer (or coupling magnetic layer structure) in the arrangements, for example as shown in FIGS. 2A and 2B. These layers may fulfill the utmost requirement to realize the switching method of various embodiments, as well as the reading method of various embodiments as described herein.

In various embodiments, the MTJ stack may include or consist of the layers as described above, as well as an interlayer (or non-magnetic coupling layer) and another ferromagnetic layer (or magnetic layer), for example as shown as SAF in FIGS. 3A to 3D. The two additional layers may assist in reducing the stray field generated by the reference layer (or reference magnetic layer structure) on the free layer (or free magnetic layer structure), and also to enhance the reference layer stability.

In various embodiments, the MTJ stack may include or consist of the layers as described above, with an additional antiferromagnetic (AFM) layer in contact with the SAF layer. The AFM layer may allow increasing furthermore the stability of the SAF layer, and therefore the reference layer.

The insulating layer of various embodiments may include or consist of an oxide of the following materials and any combinations therefore: Mg, Cr, Al, Si, Ti, V, Cu, Zn, Ga, Ge, Hf, Ta, W. The material choice may be determined by its dielectric constant which should be maximum (e.g., so as to maximize the E-field effect) as well as its tunneling nature to provide a high TMR value that may be obtained with the free and reference layers. Its thickness may range between about 1 nm and about 2.5 nm so that the electrical conduction through it may be by the tunneling effect, direct or indirect, and the E-Field effect may prevail over STT.

In further embodiments, the insulating layer may include or consist of an organic compound with at least insulating properties, such as Alq3 or PVDF, for example, or any combination of an oxide as described above and an organic compound.

The free layer (or free magnetic layer structure) may include or consist of any of the following materials and alloys: Cr, Mn, Fe, Co, Ni, B, C, O, N, Al, Si, Ti, V, Cu, Zn, Ga, Ge, Zr, Nb, Mo, Pd, Ag, Sb, Te, Hf, Ta, W, Ir, Pt, Au, Mg or any combination thereof as multilayers (e.g. Co/Ta/Co, Fe/Ta/Fe/Ta/Fe, Ni/Ta/Fe), as alloys (e.g. CoFeB, CoFeBTa, CoFeZn) or both (e.g. CoFeB/CoFeBTa/CoFeB). The alloys compositions may be arbitrary. The free layer may have a net magnetic moment when no magnetic field is applied, i.e., may be ferrimagnetic or ferromagnetic. Its magnetization may range between about 300 $emu/cm^3$ and about 1500 $emu/cm^3$. The free layer magnetization may have a magnetic easy axis perpendicular to the plane which may at least partially originate from the interfacial magnetic anisotropy between the free layer and the insulating layer. The effective perpendicular magnetic anisotropy of the free layer may be between about 0.1 $Merg/cm^3$ and about 10 $Merg/cm^3$. When an E-Field is applied across the memory cell or the magnetoelectric device, the aforementioned interfacial magnetic anisotropy may be enhanced or reduced depending on the sign of the E-Field. The E-Field may allow switching of the direction of the magnetization of the free layer from out-of-plane to in-plane. The total thickness of the free layer may be between about 1 nm and about 4 nm. In various embodiments, one or more layers may be laminated within the free layer (or free magnetic layer structure) to tailor the properties of the effect of an E-Field applied on the memory cell.

The coupled layer (or coupling magnetic layer structure) may include or consist of any of the following materials, oxides and alloys: Cr, Mn, Fe, Co, Ni, B, C, O, N, Al, Si, Ti, V, Cu, Zn, Ga, Ge, Zr, Nb, Mo, Pd, Ag, Sb, Te, Hf, Ta, W, Ir, Pt, Au, Mg or any combination thereof as multilayers (e.g. multilayers of [Co/Pt], multilayers of [Co/Pd], multilayers of [Co/Ni]), as alloys (e.g. CoPt, CoPd, CoFeBPt), as both (e.g. multilayers of [CoFe/Ni]) or including an oxide (e.g. CoFeB/MgO). The alloys compositions may be arbitrary. In embodiments where an oxide may be present, its contribution to the memory cell resistance or the magnetoelectric device resistance must be at least 10 times lower than that of the insulating layer to avoid reducing the TMR of the whole device. The coupled layer may have a net magnetic moment when no magnetic field is applied, i.e., may be ferrimagnetic or ferromagnetic. Its magnetic moment may be different from that of the free layer and the magnetization may range between about 300 $emu/cm^3$ and about 1500 $emu/cm^3$. The coupled layer magnetization may have a magnetic easy axis perpendicular to the plane. The perpendicular magnetic anisotropy of the coupled layer may be large enough that its magnetization does not turn in plane when the free layer turns in plane. The aforementioned perpendicular magnetic anisotropy of the coupled layer may be small enough that the magnetization of the coupled layer may switch through the mechanism described herein, when a correct E-Field is applied to the memory cell. The effective perpendicular magnetic anisotropy of the coupled layer may be between about 0.1 $Merg/cm^3$ and about 10 $Merg/cm^3$. Its thickness may be between 1 nm and about 10 nm.

The non-magnetic spacer layer of various embodiments may include or consist of any of the following materials: ruthenium (Ru), rhodium (Rh), chromium (Cr), vanadium (V), molybdenum (Mo), or combinations or alloys of these such as Ru—Ta in the thickness range from about 0.3 nm to about 2 nm. The materials may be chosen so that an antiferromagnetic coupling exists between the free layer (or free magnetic layer structure) and the coupled layer (or coupling magnetic layer structure).

The reference layer (or reference magnetic layer structure) may include or consist of any of the following materials and alloys: Cr, Mn, Fe, Co, Ni, B, C, O, N, Al, Si, Ti, V, Cu, Zn, Ga, Ge, Zr, Nb, Mo, Pd, Ag, Sb, Te, Hf, Ta, W, Ir, Pt, Au, Mg or any combination thereof as multilayers (e.g.

multilayers of [Co/Pt], multilayers of [Co/Pd], multilayers of [Co/Ni]), as alloys (e.g. CoPt, CoPd, CoFeBPt), or both (e.g. [Co/Pt]n/Ta/CoFeB). The alloys compositions and structures may be arbitrary. The reference layer may have a net magnetic moment when no magnetic field is applied, i.e., may be ferrimagnetic or ferromagnetic. The magnetization of the reference layer may be chosen as low as possible in order to reduce the stray field and may range between about 300 emu/cm$^3$ and about 1500 emu/cm$^3$. The reference layer magnetization may have a magnetic easy axis perpendicular to the plane. The effective perpendicular magnetic anisotropy of the reference layer may be between about 1 Merg/cm$^3$ and about 50 Merg/cm$^3$. Its thickness may be between about 1 nm and about 15 nm.

The interlayer (or non-magnetic coupling layer, first non-magnetic coupling layer or second non-magnetic coupling layer) may include or consist of any of the following materials: ruthenium (Ru), rhodium (Rh), chromium (Cr), vanadium (V), molybdenum (Mo), or combinations and alloys of these such as Ru—Ta in the thickness range from about 0.3 nm to about 2 nm. The materials may be chosen so that an antiferromagnetic coupling exists between the SAF layer (or magnetic layer) and the reference layer (or reference magnetic layer structure) and between the first SAF layer (or first magnetic layer) and the second SAF layer (or second magnetic layer).

The SAF layer (or magnetic layer), the first SAF layer (or first magnetic layer) and the second SAF layer (or second magnetic layer) may include or consist of any of the following materials and alloys: Cr, Mn, Fe, Co, Ni, B, C, O, N, Al, Si, Ti, V, Cu, Zn, Ga, Ge, Zr, Nb, Mo, Pd, Ag, Sb, Te, Hf, Ta, W, Ir, Pt, Au, Mg or any combination thereof as multilayers (e.g. multilayers of [Co/Pt], multilayers of [Co/Pd], multilayers of [Co/Ni]), as alloys (e.g. CoPt, CoPd, CoFeBPt), or both (e.g. [Co/Pt]n/Ta/CoFeB). The alloys compositions are arbitrary. The SAF layer, the first SAF layer and the second SAF layer may have a net magnetic moment when no magnetic field is applied, i.e., may be ferrimagnetic or ferromagnetic. The SAF layer, the first SAF layer and the second SAF layer magnetization may be such that the superposition of the stray fields generated by the SAF layer, the first SAF layer and the second SAF layer and the reference layer at the free layer plane has a value close to 0 Tesla. The associated respective magnetizations may be in the range between about 300 emu/cm$^3$ and about 1500 emu/cm$^3$. The associated respective magnetizations may have a magnetic easy axis perpendicular to the plane. The effective perpendicular magnetic anisotropy of the SAF layer, the first SAF layer and the second SAF layer may be between about 1 Merg/cm$^3$ and about 50 Merg/cm$^3$. The thickness may be between about 1 nm and about 15 nm.

The antiferromagnetic (AFM) layer of various embodiments may include or consist of any of the following alloys: PtMn, IrMn, FeMn, NiMn, NiO and so on. Its thickness should be larger than its critical thickness for stable exchange coupling, which may range from about 5 nm to about 30 nm.

In the context of various embodiments, the values specified are chosen as non-limiting examples for realising the switching scheme as described herein, as well as the reading mechanism as described herein.

Various embodiments may be integrated in a Magnetic Random Access Memory (MRAM), and which may provide unipolar voltage-controlled write and read operations, and/or low-power consumption (e.g., <10 fJ), and/or ultra-fast switching (e.g., <500 ps).

As described above, various embodiments may provide a promising unipolar switching scheme. Various embodiments may provide one or more of the following: (1) no in-plane field (e.g., magnetic field) required; (2) insensitive to process variations; (3) low energy consumption and fast switching; or (4) compatible with device fabrication process.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

The invention claimed is:

1. A magnetoelectric device comprising:
   a reference magnetic layer structure having a fixed magnetization orientation; and
   a synthetic antiferromagnetic layer structure comprising a free magnetic layer structure and a coupling magnetic layer structure antiferromagnetically coupled to each other, each of the free magnetic layer structure and the coupling magnetic layer structure having a magnetization orientation that is variable; and
   an insulating layer arranged in between the free magnetic layer structure and the reference magnetic layer structure;
   wherein the insulating layer is configured to prevent the free magnetic layer structure being subjected to spin-transfer torque effect; and
   wherein the reference magnetic layer structure and the synthetic antiferromagnetic layer structure are arranged one over the other.

2. The magnetoelectric device as claimed in claim 1, wherein the magnetization orientation of the free magnetic layer structure is variable from a first direction to a second direction different from the first direction in response to a first voltage applied to the magnetoelectric device.

3. The magnetoelectric device as claimed in claim 2, wherein the magnetization orientation of the free magnetic layer structure is variable from the second direction to the first direction in response to a second voltage applied to the magnetoelectric device, the first voltage and the second voltage having a same polarity.

4. The magnetoelectric device as claimed in claim 1, wherein the magnetization orientation of the free magnetic layer structure is variable between a first direction and a second direction different from the first direction in response to a voltage applied to the magnetoelectric device without the free magnetic layer structure being subjected to at least one of spin-transfer torque effect or a magnetic field.

5. The magnetoelectric device as claimed in claim 1, wherein a magnetic moment of the free magnetic layer structure is more than a magnetic moment of the coupling magnetic layer structure.

6. The magnetoelectric device as claimed in claim 1, wherein the synthetic antiferromagnetic layer structure further comprises a non-magnetic spacer layer arranged in between the free magnetic layer structure and the coupling magnetic layer structure.

7. The magnetoelectric device as claimed in claim 1, further comprising a pinning magnetic layer structure configured to pin the fixed magnetization orientation of the reference magnetic layer structure.

8. The magnetoelectric device as claimed in claim 7, wherein the pinning magnetic layer structure comprises a magnetic layer antiferromagnetically coupled to the reference magnetic layer structure.

9. The magnetoelectric device as claimed in claim 8, wherein the pinning magnetic layer structure further comprises an antiferromagnetic layer associated with the magnetic layer.

10. The magnetoelectric device as claimed in claim 7, wherein the pinning magnetic layer structure comprises:
    a first magnetic layer and a second magnetic layer antiferromagnetically coupled to each other, the first magnetic layer being arranged between the reference magnetic layer structure and the second magnetic layer, wherein the first magnetic layer is antiferromagnetically coupled to the reference magnetic layer structure.

11. The magnetoelectric device as claimed in claim 10, wherein the pinning magnetic layer structure further comprises an antiferromagnetic layer associated with the second magnetic layer.

12. The magnetoelectric device as claimed in claim 1, further comprising a magnesium oxide layer in contact with the coupling magnetic layer structure.

13. The magnetoelectric device as claimed in claim 1, wherein the magnetoelectric device has perpendicular magnetic anisotropy.

14. A method for forming a magnetoelectric device, the method comprising:
    forming a reference magnetic layer structure having a fixed magnetization orientation;
    forming a synthetic antiferromagnetic layer structure comprising a free magnetic layer structure and a coupling magnetic layer structure antiferromagnetically coupled to each other, each of the free magnetic layer structure and the coupling magnetic layer structure having a magnetization orientation that is variable; and
    forming an insulating layer arranged in between the free magnetic layer structure and the reference magnetic layer structure;
    wherein the insulating layer is configured to prevent the free magnetic layer structure being subjected to spin-transfer torque effect; and
    wherein the reference magnetic layer structure and the synthetic antiferromagnetic layer structure are arranged one over the other.

15. The method as claimed in claim 14, wherein a magnetic moment of the free magnetic layer structure is more than a magnetic moment of the coupling magnetic layer structure.

* * * * *